(12) United States Patent
Takabayashi

(10) Patent No.: US 7,242,697 B2
(45) Date of Patent: Jul. 10, 2007

(54) WAVELENGTH SELECTION DEVICE, WAVELENGTH SELECTION LASER, AND TUNABLE LASER

(75) Inventor: Kazumasa Takabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 308 days.

(21) Appl. No.: 10/459,605

(22) Filed: Jun. 12, 2003

(65) Prior Publication Data

US 2003/0231688 A1 Dec. 18, 2003

(30) Foreign Application Priority Data

| Jun. 14, 2002 | (JP) | ............................. 2002-173954 |
| Oct. 18, 2002 | (JP) | ............................. 2002-303948 |
| Jan. 22, 2003 | (JP) | ............................. 2003-013236 |

(51) Int. Cl.
  *H01S 3/10* (2006.01)
(52) U.S. Cl. .................. 372/20; 372/15; 372/106
(58) Field of Classification Search ............ 372/13, 372/20, 27, 15, 106
  See application file for complete search history.

(56) References Cited

U.S. PATENT DOCUMENTS

| 5,552,912 | A | * | 9/1996 | Sharp et al. ................ 349/117 |
| 5,724,373 | A | * | 3/1998 | Chang ......................... 372/20 |
| 5,912,762 | A | * | 6/1999 | Li et al. ...................... 359/352 |
| 5,949,801 | A | * | 9/1999 | Tayebati ...................... 372/20 |
| 2002/0067895 | A1 | * | 6/2002 | Flanders ...................... 385/88 |
| 2003/0002050 | A1 | * | 1/2003 | Tatsuno et al. ............. 356/519 |
| 2004/0071181 | A1 | * | 4/2004 | Huang ......................... 372/106 |
| 2004/0202223 | A1 | * | 10/2004 | Crosson et al. ............... 372/97 |

FOREIGN PATENT DOCUMENTS

| JP | 2001-370907 | 6/2003 |
| JP | 2003-174185 | 6/2003 |

OTHER PUBLICATIONS

Patent Abstracts of Japan, Publication No. 11-125801, dated May 11, 1999/Discussed in the specification.
Patent Abstracts of Japan, Publication No. 2000-133863, dated May 12, 2000/Discussed in the specification.
Patent Abstracts of Japan, Publication No. 2000-261086, dated Sep. 22, 2000.
Patent Abstracts of Japan, Publication No. 04-061181, dated Feb. 27, 1992.
Patent Abstracts of Japan, Publication No. 06-077568, dated Mar. 18, 1994.

* cited by examiner

*Primary Examiner*—Dung (Michael) T. Nguyen
(74) *Attorney, Agent, or Firm*—Armstrong, Kratz, Quintos, Hanson & Brooks, LLP

(57) ABSTRACT

A wavelength selection filter, a wavelenth selection laser, and a tunable laser for suppressing adverse effects of non-selected light when selected light is obtained by the wavelength selection filter. A linear polarizer is arranged on a side of the wavelength selection filter from which incoming light enters, and a first faraday element and a second faraday element arranged at respective locations between the linear polarizer and the wavelength selection filter, and between the wavelength selection filter and a reflection mirror for reflecting light having passed through the wavelength selection filter. After incoming light passes through a linear polarizer, selected light passes through the wavelength selection filter and is reflected by the reflection mirror, while non-selected light is reflected by the wavelength selection filter. The selected light and the non-selected light differ in the number of times they pass through faraday elements before they return to the linear polarizer.

23 Claims, 26 Drawing Sheets

NO CHANGE IN THICKNESS OF SPACER

THICKNESS OF SPACER CHANGED BY 1/4 OF WAVELENGTH

THICKNESS OF SPACER CHANGED BY 1/2 OF WAVELENGTH

WAVELENGTH SELECTION DEVICE, WAVELENGTH SELECTION LASER, AND TUNABLE LASER

CROSS-REFERENCE TO RELATED APPLICATIONS

This application is based on, and claims priority to, Japanese Applications No. 2002-173954, filed Jun. 14, 2002, No. 2002-303948, filed Oct. 18, 2002, and No. 2003-013236, filed Jan. 22, 2003, in Japan, and which are incorporated herein by reference.

BACKGROUND OF THE INVENTION

1. Field of the Invention

This invention relates to a wavelength selection device, a wavelength selection laser, and a tunable laser, and more particularly to a wavelength selection device, a wavelength selection laser, and a tunable laser, each of which includes a wavelength selection filter for passing light of desired wavelengths and reflecting light of wavelengths other than the desired wavelengths, and makes use of light which passes through the wavelength selection filter and is then reflected by a reflection mirror arranged at the rear of the wavelength selection filter to return to the wavelength selection filter again.

2. Description of the Related Art

Recently, with a drastic increase in communication demands, development has been actively carried out on a wavelength division multiplexing system (WDM system) which enables large capacity transmission through a single optical fiber, by multiplexing a plurality of signal lights of different wavelengths. In such a WDM system, there is a great demand for a wavelength selection filter and a wavelength selection laser capable of selecting desired wavelengths from a wide range of wavelengths, to implement the system.

FIG. 25 is a conceptual representation of the wavelength selection laser which employs the wavelength selection filter. In one method of realizing the wavelength selection laser, a gain medium 202 covering a wide bandwidth and a wavelength selection filter 203 are arranged within a resonator formed by two reflection mirrors 200 and 201 arranged opposed to each other. In this method, when a filter, such as a Fabry-Perot (FP) etalon, which passes light of desired wavelengths and reflects light of wavelengths other than the desired wavelengths, is used as the wavelength selection filter 203, the light (selected light) that passes through the filter is resonated between the reflection mirrors 200 and 201, eventually causing laser oscillation to occur.

As the wavelength selection filter 203, it is possible to use a filter in which an FP etalon is formed by a quartz plate designed to have a predetermined thickness according to the wavelengths of light to be allowed to pass and having opposite surfaces thereof covered with predetermined reflection coating. There has been also proposed another conventional wavelength selection filter in which transparent substrates on a light-introducing side and a light-emitting side thereof are formed, e.g., by two sheets of polarizers, and two sheets of polarization rotators joined to outer sides of the two sheets of polarizers, for rotating respective polarization planes in opposite directions, and a liquid crystal is held with the transparent substrates via a spacer (see Japanese Laid-Open Patent Publication (Kokai) No. 11-125801). In this case, the polarization rotators, which are trapezoidal in cross section, are provided for varying polarized states of light transmitted through the polarization rotators, to thereby depolarize the incoming light, and the two sheets of polarization rotators are arranged such that respective directions in which the polarization planes are rotated thereby are made opposite to each other, whereby a wavelength selection filter is made capable of coping with incoming lights from two directions. Further, there is another example of the conventional wavelength selection filter which is configured such that two sheets of tabular mediums have reflection planes formed on respective one end surfaces thereof in a manner opposed to each other, and a spacer having a predetermined length is held between the reflection planes to form an FP etalon (see Japanese Laid-Open Patent Publication (Kokai) No. 2000-133863).

Now, the wavelength selection laser employing the wavelength selection filter suffers from a problem that when light (non-selected light) reflected by the wavelength selection filter without passing therethrough goes back into the resonator, it is impossible to produce stable laser oscillation at a desired wavelength. To overcome this problem, the wavelength selection laser is required to suppress the adverse effects of the non-selected light.

FIG. 26 is a diagram which is useful in explaining a conventional method of suppressing adverse effects of non-selected light. It should be noted that in FIG. 26, component parts and elements similar or equivalent to those of the wavelength selection laser shown in FIG. 25 are designated by identical reference numerals.

In the conventional method, to inhibit non-selected light reflected by the wavelength selection filter 203 from going back into the resonator, the wavelength selection filter 203 is arranged at an angle or in a manner inclined with respect to the optical axis. As a result of this configuration, selected light or component of light incident on the wavelength selection filter 203 passes therethrough, and is then reflected by the reflection mirror 201 to return to the filter 203 to pass therethrough. On the other hand, non-selected light is reflected by the wavelength selection filter 203, though in a manner deviated from the optical axis of the incident light or the selected light, because the wavelength selection filter 203 is arranged at an angle. Thus, the non-selected light is prevented from returning to the resonator.

However, the arrangement of the wavelength selection filter 203 at an angle with respect to the optical axis causes degradation of finesse and an increase in insertion loss, resulting in the degraded characteristics of the wavelength selection laser. Particularly, when the FP etalon of high finesse is inclined, e.g., at two degrees or more with respect to the incident direction, the finesse is degraded to a level equal to or less than 50% thereof, while the insertion loss thereof is increased up to 5 dB (decibels). This means that a wavelength selection laser designed to cause laser oscillation to occur at a wavelength selected by the wavelength selection filter, and further a tunable laser configured to cause laser oscillation to occur by selecting light of an arbitrary one of wavelengths selected by the filter are degraded in wavelength selectivity, which makes it difficult to cause stable laser oscillation.

Further, the arrangement of the wavelength selection filter at an angle with respect to the optical axis can cause an increase in size of the wavelength selection filter itself, the wavelength selection laser, or the tunable laser, employing the filter. Further, because fine adjustment of the angle of the wavelength selection filter is required, there remains another problem of troublesome alignment of the filter.

SUMMARY OF THE INVENTION

The present invention has been made in view of these points, and an object thereof is to provide a wavelength selection device which suppresses adverse effects of non-selected light reflected by a wavelength selection filter, and prevents degradation of finesse and an increase in insertion loss.

Further, another object of the invention is to provide a wavelength selection laser which employs the wavelength selection device and causes stable laser oscillation to occur at a wavelength selected by the wavelength selection device, and a tunable laser which employs the wavelength selection device and causes stable laser oscillation to occur at an arbitrary wavelength selected from wavelengths selected by the wavelength selection device.

Further, still another object of the invention is to provide a wavelength selection device, a wavelength selection laser, and a tunable laser, each of which is made compact in size, and simplified in alignment.

To attain the above objects, there is provided a wavelength selection device including a wavelength selection filter for passing at least one component of at least one desired wavelength of an incoming light and reflecting components of wavelengths other than the at least one desired wavelength of the incoming light, wherein the at least one component having passed through the wavelength selection filter is reflected by a reflection mirror back to the wavelength selection filter, to thereby obtain the at least one component of the at least one desired wavelength. This wavelength selection device comprises a linear polarizer arranged on a side of the wavelength selection filter from which the incoming light enters the wavelength selection filter, and at least one element for rotating a polarization of light by 45 degrees, arranged at each of respective locations between the linear polarizer and the wavelength selection filter, and between the wavelength selection filter and the reflection mirror.

To attain the above objects, there is also provided a wavelength selection laser for causing laser oscillation to occur at at least one wavelength selected by a wavelength selection device. This wavelength selection laser comprises a wavelength selection device including a wavelength selection filter for passing at least one component of at least one desired wavelength of an incoming light and reflecting components of wavelengths other than the at least one desired wavelength of the incoming light, a reflection mirror for reflecting the at least one component having passed through the wavelength selection filter, a linear polarizer arranged on a side of the wavelength selection filter from which the incoming light enters the wavelength selection filter, and at least one element for rotating a polarization of light by 45 degrees, arranged at each of respective locations between the linear polarizer and the wavelength selection filter, and between the wavelength selection filter and the reflection mirror, a second reflection mirror arranged on a side of the wavelength selection device from which the incoming light enters the wavelength selection device, in a manner opposed to the reflection mirror, and a gain medium arranged between the wavelength selection device and the second reflection mirror, for producing an optical gain.

To attain the above objects, there is also provided a tunable laser for causing laser oscillation to occur by selecting a component of light of an arbitrary one of wavelengths selected by a wavelength selection device. This tunable laser comprises a wavelength selection device including a wavelength selection filter for passing components of desired wavelengths of an incoming light and reflecting components of wavelengths other than the desired wavelengths of the incoming light, a reflection mirror for reflecting the components having passed through the wavelength selection filter, a linear polarizer arranged on a side of the wavelength selection filter from which the incoming light enters the wavelength selection filter, and at least one element for rotating a polarization of light by 45 degrees, arranged at each of respective locations between the linear polarizer and the wavelength selection filter, and between the wavelength selection filter and the reflection mirror, a second reflection mirror arranged on a side of the wavelength selection device from which the incoming light enters the wavelength selection device, in a manner opposed to the reflection mirror, a gain medium arranged between the wavelength selection device and the second reflection mirror, for producing an optical gain, and a tunable filter arranged between the gain medium and the wavelength selection device, for selecting a component of an arbitrary wavelength out of the components selected by the wavelength selection device.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 21(A) to 21(C) are diagrams which are useful in explaining changes in wavelengths allowed to pass through an etalon, caused by changes in the thickness of a spacer, in which:

FIG. 21(A) shows a case where the thickness of the spacer is not changed;

FIG. 21(B) shows a case where the thickness of the spacer is changed by ¼ of the wavelength; and FIG. 21(C) shows a case where the thickness of the spacer is changed by ½ of the wavelength;

DESCRIPTION OF THE PREFERRED EMBODIMENTS

The invention will now be described in detail with reference to the drawings showing preferred embodiments thereof.

First, a description will be given of a first embodiment of the invention.

Figure 1:
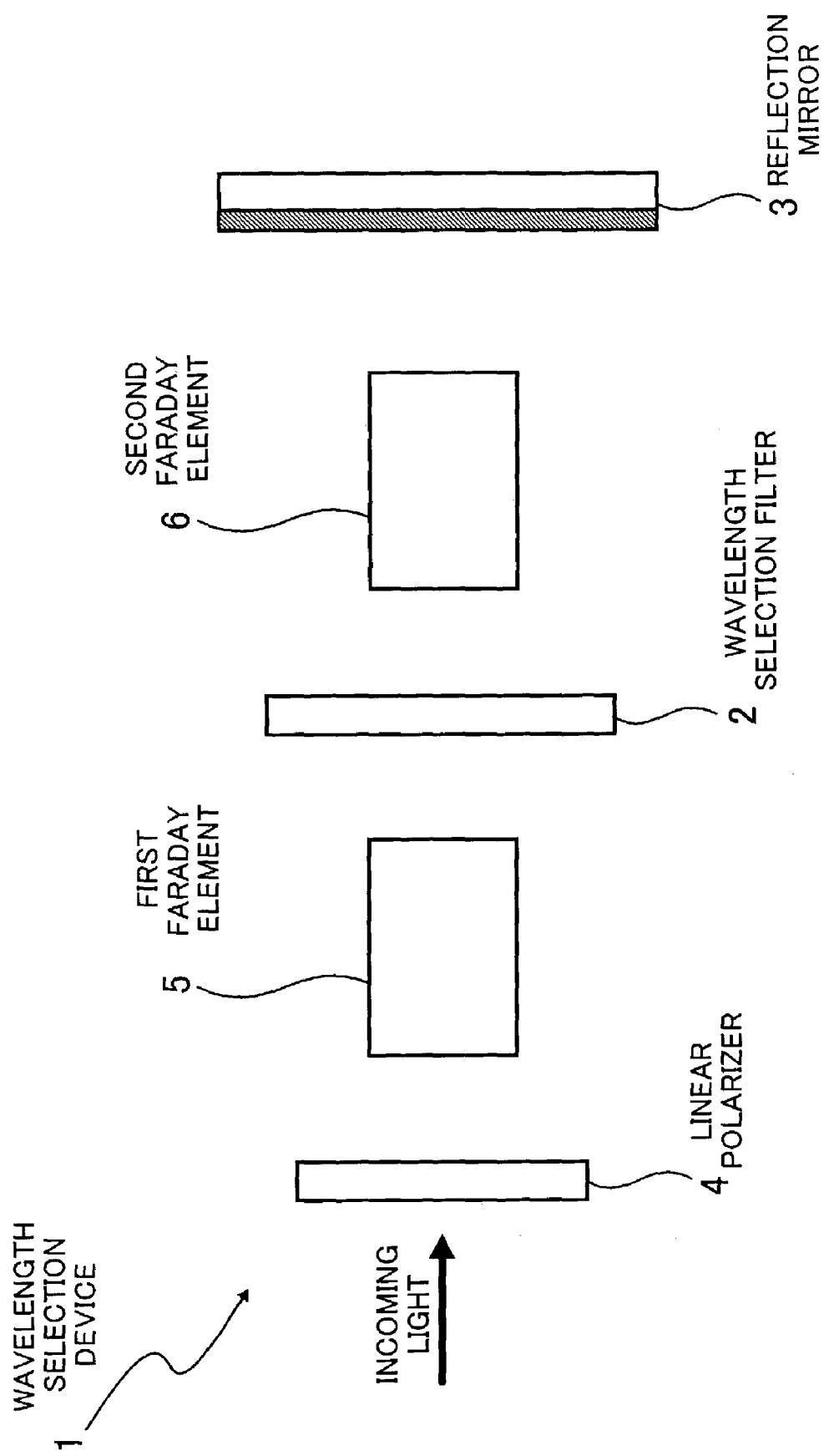
FIG. 1 is a diagram showing the construction of a wavelength selection device according to a first embodiment of the invention.

FIG. 1 shows the construction of a wavelength selection device according to the first embodiment. The wavelength selection device 1 shown in FIG. 1 includes a wavelength selection filter 2 for passing light (selected light) of desired wavelengths and reflecting light (non-selected light) of wavelengths other than the desired wavelengths, and a reflection mirror 3 for reflecting the selected light having passed through the wavelength selection filter 2. The wavelength selection device 1 has a linear polarizer 4 and a first faraday element 5, arranged in front of the wavelength selection filter 2, that is, on a side from which incoming light enters the wavelength selection device 1. Further, the wavelength selection device 1 has a second faraday element 6 arranged at the rear of the wavelength selection filter 2, that is, between the wavelength selection filter 2 and the reflection mirror 3.

The wavelength selection filter 2 of the wavelength selection device 1 can be implemented by an FP (Fabry-Perot) etalon, for instance. The FP etalon is formed e.g. by a quartz plate configured such that it has opposite surfaces thereof coated with high reflection coating films, and a thickness designed to pass light of wavelengths conforming to the ITU-T grid.

The reflection mirror 3 is formed by a dielectric multilayer film, for instance, and designed to have a reflectance of 99% or more with respect to light within a wavelength range of 1.52 μm to 1.62 μm.

The linear polarizer 4 is formed by using a Glan-Thompson prism made of calcite, for instance, such that it passes only components of incident light with a specific polarization direction.

Each of the first faraday element 5 and the second faraday element 6 is implemented by a magnetic garnet single crystal, and the length thereof is designed such that the polarization of light passing therethrough is rotated by 45 degrees.

Figure 2:
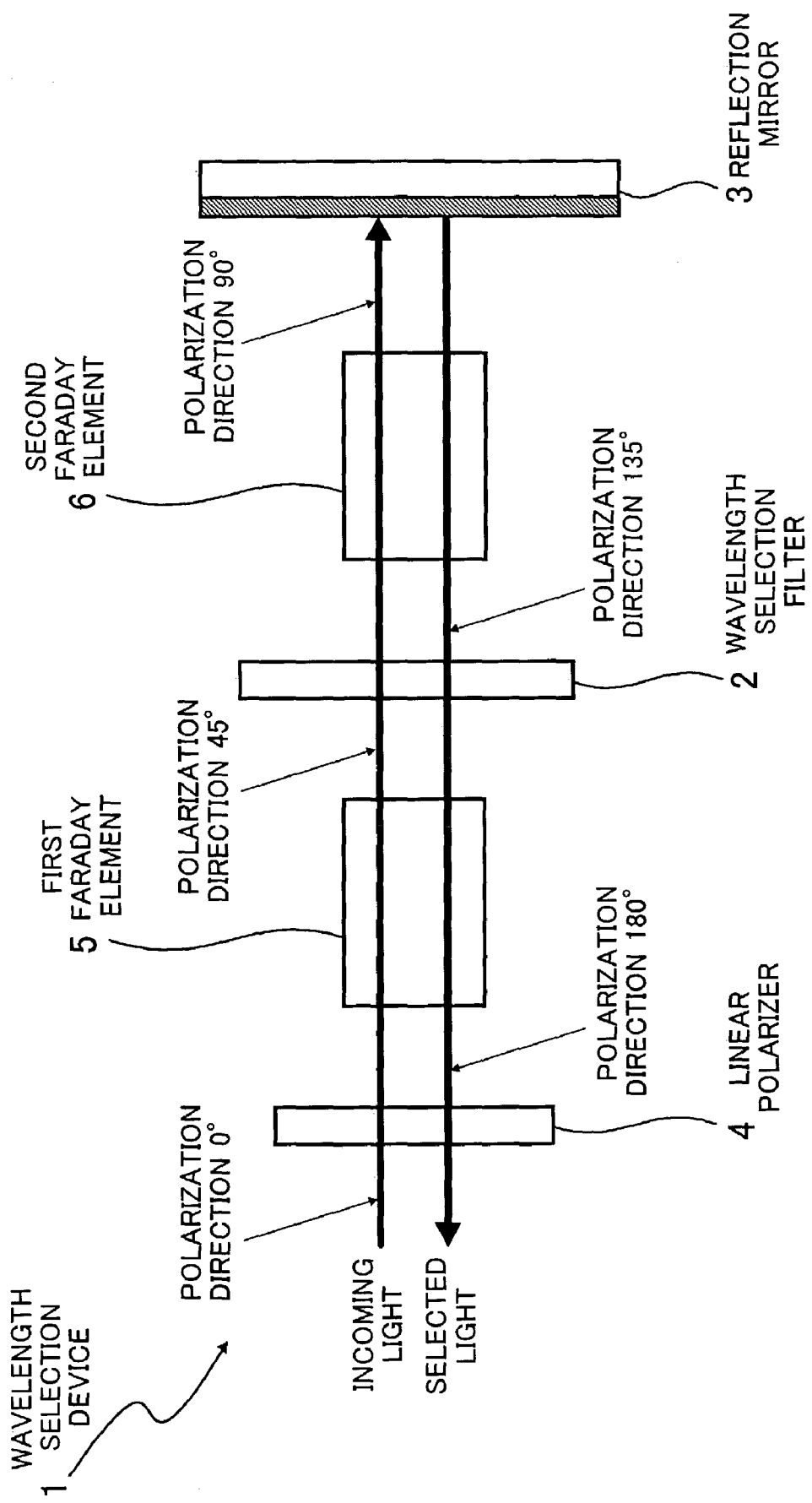
FIG. 2 is a diagram showing a case where light passes through a wavelength selection filter, which is useful in explaining the principle of the wavelength selection device according to the first embodiment.
Figure 3:
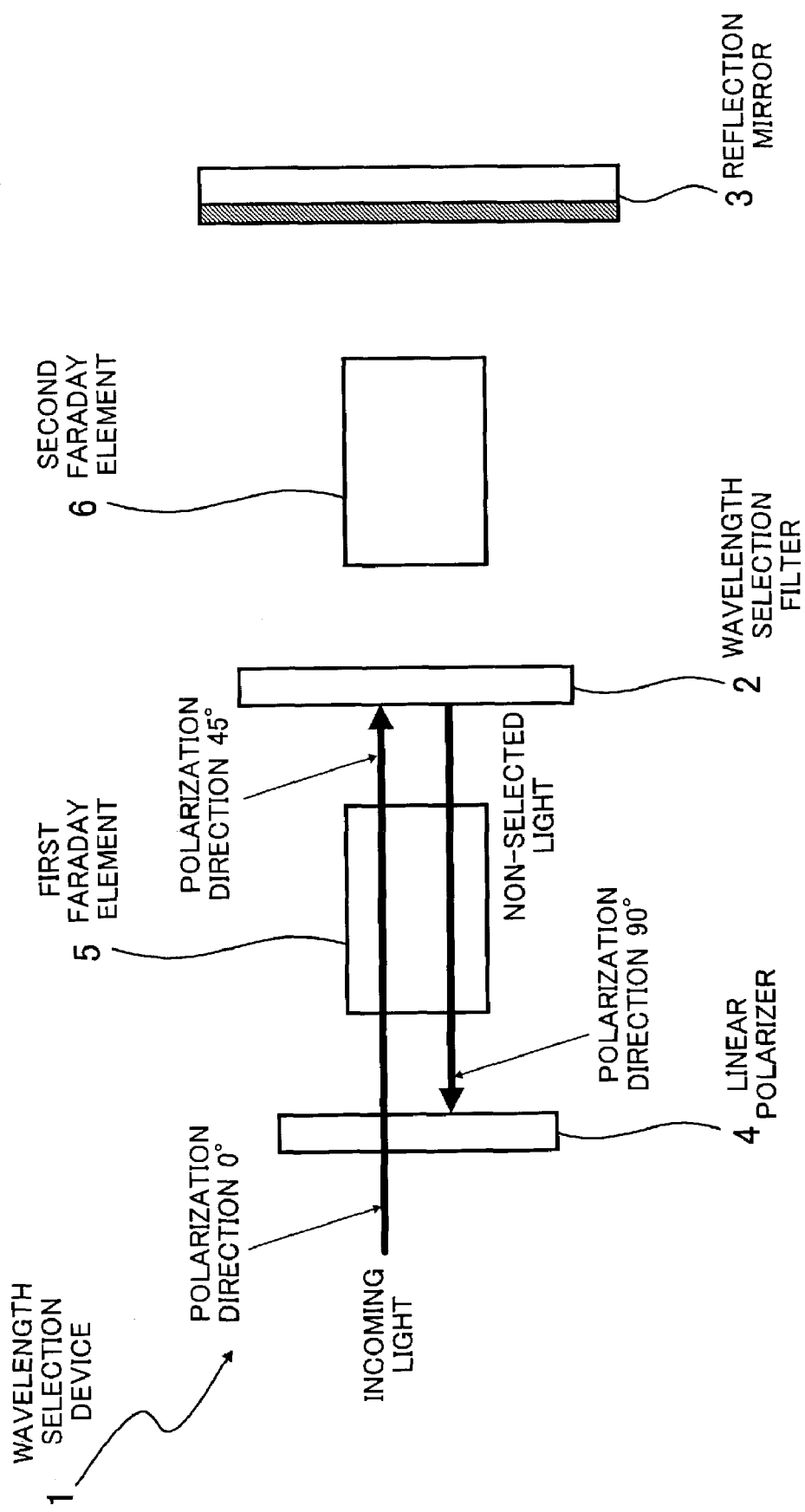
FIG. 3 is a diagram showing a case where light is reflected by the wavelength selection filter, which is useful in explaining the principle of the wavelength selection device according to the first embodiment.

Now, the principle of suppressing the adverse effects of light reflected from the wavelength selection filter 2 in the wavelength selection device 1 constructed as above will be described with reference to FIGS. 2 and 3. FIG. 2 is a diagram showing a case where light passes through the wavelength selection filter, which is useful in explaining the principle of the wavelength selection device according to the first embodiment. FIG. 3 is a diagram showing a case where light is reflected by the wavelength selection filter, which is useful in explaining the principle of the wavelength selection device according to the first embodiment.

First, the wavelength selection device 1 is configured such that incoming light is in the form of linearly polarized light and the polarization direction of the linearly polarized light coincides with the polarization direction of the linear polarizer 4. As shown in FIG. 2, out of light having passed through the linear polarizer 4, components (light) of wavelengths allowed to pass through the wavelength selection filter 2 passes through the first faraday element 5, the wavelength selection filter 2, and the second faraday element 6, in the mentioned order, to reach the reflection mirror 3. Then, the light reflected by the reflection mirror 3 passes again through the second faraday element 6, the wavelength selection filter 2, and the first faraday element 5, in the mentioned order, to reach the linear polarizer 4. In the meantime, the light of the wavelengths allowed to pass through the wavelength selection filter 2, that is, the selected light, passes through the faraday element four times. Therefore, assuming that faraday elements are used for each rotating the polarization by 45 degrees, the polarization of the selected light is rotated through 180 degrees before the selected light returns to the linear polarizer 4. This means that the selected light can pass through the linear polarizer 4.

On the other hand, as shown in FIG. 3, light of wavelengths to be reflected by the wavelength selection filter 2 is reflected by the wavelength selection filter 2 after passing through the first faraday element 5, and passes through the first faraday element 5 again, to reach the linear polarizer 4. In the meantime, the light of the wavelengths to be reflected by the wavelength selection filter 2, that is, the non-selected light passes through the faraday element twice, and hence the polarization of the non-selected light is rotated through 90 degrees before it returns to the linear polarizer 4. Therefore, the non-selected light is blocked by the linear polarizer 4.

As described above, the wavelength selection device 1 is configured such that only selected light allowed to pass through the wavelength selection filter 2 is taken out, and non-selected light to be reflected by the wavelength selection filter 2 is not taken out. This makes it possible to suppress adverse effects of non-selected light reflected from the wavelength selection filter 2.

Further, according to the wavelength selection device 1 of the first embodiment, the wavelength selection filter 2 is not arranged at an angle, i.e., in a manner inclined with respect to an incident angle as in the prior art, whereby the light can enter the wavelength selection filter 2 perpendicularly, i.e., at right angles, thereto. This makes it possible to prevent the degradation of finesses of the wavelength selection filter 2, and suppress an increase in insertion loss. In the present embodiment, the insertion loss occurring with the linear polarizer 4, the first faraday element 5, and the second faraday element 6, in the optimum arrangement of the optimum elements or devices used, is approximately 0.7 dB in one way. This value is smaller than an increase in insertion loss occurring when the wavelength selection filter 2 formed by the FP etalon is inserted in an inclined manner, so that the total insertion loss is not increased.

Figure 4:
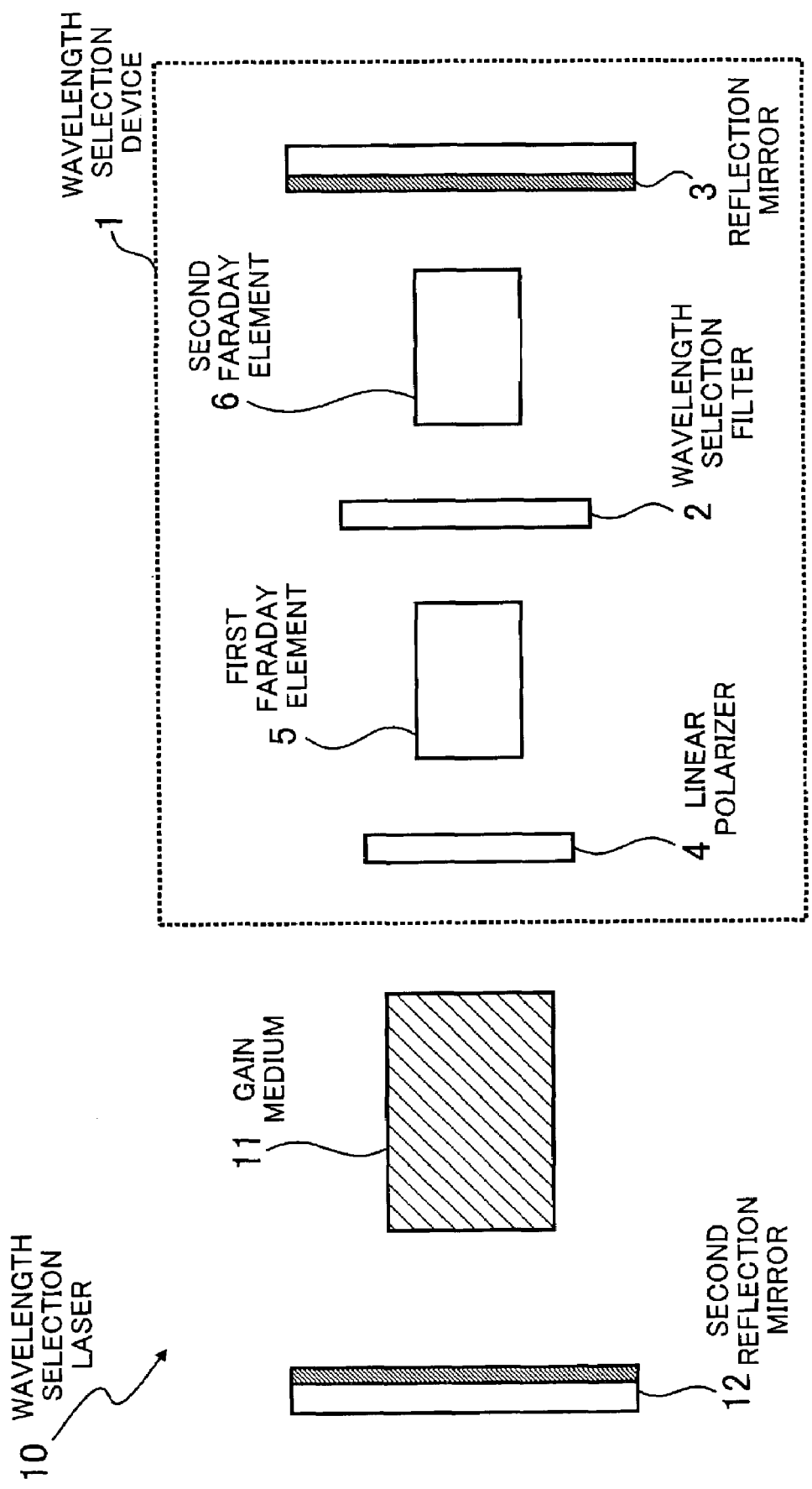
FIG. 4 is a conceptual representation of a wavelength selection laser which employs the wavelength selection device according to the first embodiment.

The wavelength selection device 1 can be arranged in a resonator, for laser oscillation. FIG. 4 is a conceptual representation of a wavelength selection laser which employs the wavelength selection device according to the first embodiment. It should be noted that in FIG. 4, component parts and elements similar or equivalent to those of the wavelength selection device 1 shown in FIG. 1 are designated by identical reference numerals, and detailed description thereof is omitted.

The wavelength selection laser 10 shown in FIG. 4 includes the wavelength selection device 1, a gain medium 11 arranged in front of the linear polarizer 4 of the wavelength selection device 1, and a second reflection mirror 12 arranged on a side remote from the linear polarizer 4 with respect to the gain medium 11. The second reflection mirror 12 and the reflection mirror 3 of the wavelength selection device 1 are arranged such that they are opposed to each other to thereby form a resonator of the wavelength selection laser 10.

In the wavelength selection laser 10 constructed as above, out of light emitted from the gain medium 11, components (light) of desired wavelengths are selected by the wavelength selection filter 2. This light of the desired wavelengths is resonated between the second reflection mirror 12 and the reflection mirror 3 of the wavelength selection device 1, and eventually lasing (laser oscillation) occurs. In this process, the wavelength selection device 1 blocks non-selected light reflected from the wavelength selection filter 2 by the linear polarizer 4, thereby inhibiting the non-selected light from returning to the second reflection mirror 12. This makes it possible to suppress adverse effects of the non-selected light on the laser oscillation without spoiling the characteristics of the wavelength selection filter 2. Therefore, it is possible to cause stable laser oscillation (lasing) to occur at wavelengths selected by the wavelength selection filter 2.

Next, a detailed description will be given of a case in which the wavelength selection device 1 according to the first embodiment is applied to a wavelength selection laser for selecting light of desired wavelengths to cause laser oscillation, and further a case in which the wavelength selection device 1 is applied to a wavelength-variable or tunable laser (as disclosed e.g. in Japanese Laid-Open Patent Publication (Kokai) No. 2000-261086) for arbitrarily selecting light of a desired wavelength from light of desired wavelengths to cause laser oscillation.

Figure 5:
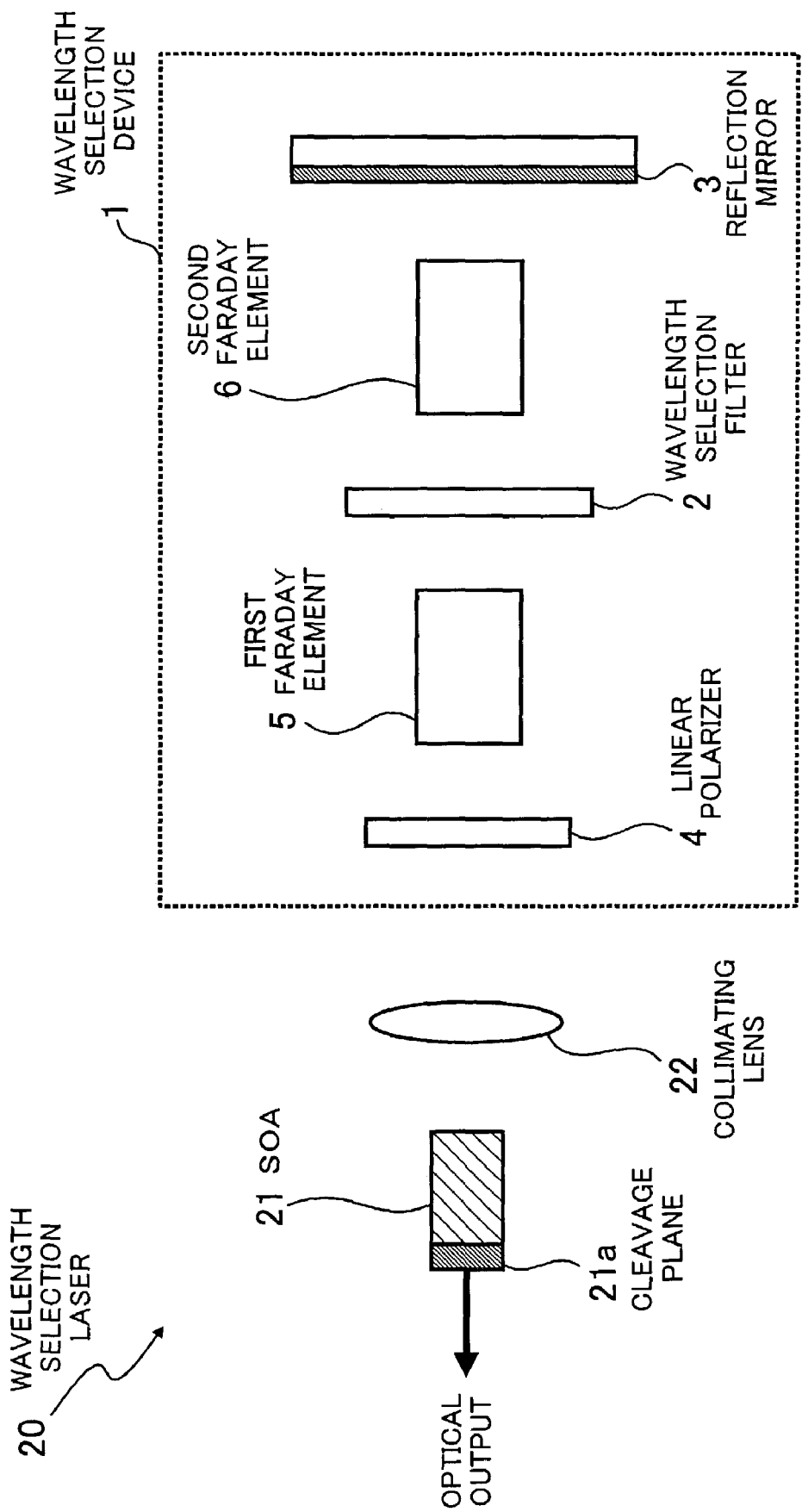
FIG. 5 is a diagram showing an example of the construction of a wavelength selection laser which employs the wavelength selection device according to the first embodiment.

First, the case in which the wavelength selection device 1 is applied to a wavelength selection laser will be described. FIG. 5 shows an example of the construction of the wavelength selection laser which employs the wavelength selection device according to the first embodiment. It should be noted that in FIG. 5, component parts and elements similar or equivalent to those of the wavelength selection device 1 shown in FIG. 1 are designated by identical reference numerals, and detailed description thereof is omitted.

The wavelength selection laser 20 shown in FIG. 5 includes the wavelength selection device 1, and has an SOA (Semiconductor Optical Amplifier) 21 as a gain medium arranged in front of the linear polarizer 4 of the wavelength selection device 1. The SOA 21 has an active layer thereof formed by a multiple quantum well, and is arranged such that a gain thereof depends on the polarization direction of light, and a polarization direction of light in which the gain is maximum coincides with the polarization direction of light transmitted through the linear polarizer 4. Further, arranged between the SOA 21 and the linear polarizer 4 is a collimating lens 22 for optically coupling the SOA 21 and the wavelength selection device 1.

Out of the end faces of the SOA 21, a laser-emitting end face, that is, an end face on a side from which an optical output is delivered from the wavelength selection laser 20 is formed as a cleavage plane 21a which serves as a reflection mirror. More specifically, a resonator is formed between the cleavage plane 21a and the reflection mirror 3 of the wavelength selection device 1. It should be noted that the cleavage plane 21a may be coated with an optical thin film having a specific reflectance. Further, one of the end faces of the SOA 21 toward the wavelength selection device 1 and the collimating lens 22 are covered with non-reflection coating.

In the wavelength selection device 1 of the wavelength selection laser 20, the wavelength selection filter 2 is formed by an FP etalon, and the reflection mirror 3 is implemented by a dielectric multilayer film mirror. Further, the first faraday element 5 and the second faraday element 6 are used as elements for rotating the polarization.

According to the wavelength selection laser 20 constructed as above, non-selected light reflected from the wavelength selection filter 2 formed by the FP etalon is blocked by the linear polarizer 4 of the wavelength selection device 1 to be thereby inhibited from returning to the cleavage plane 21a so that only selected light can be resonated. Therefore, it is possible to realize the wavelength selection laser 20 which is capable of lasing only light of wavelengths conforming to the ITU-T grid of the wavelength selection filter 2. Further, the use of the SOA 21 makes it possible to make the whole wavelength selection laser 20 compact in size. Further, the SOA 21 has a wide gain bandwidth, which enables realization of the wavelength selection laser 20 capable of selecting light over a wide wavelength range. Furthermore, because the cleavage plane 21a of the SOA 21 is used as a reflection mirror, there is no need to separately provide a reflection mirror. This makes it easy to align the component parts with each other, and at the same time make the wavelength selection laser 20 compact in size.

Figure 6:
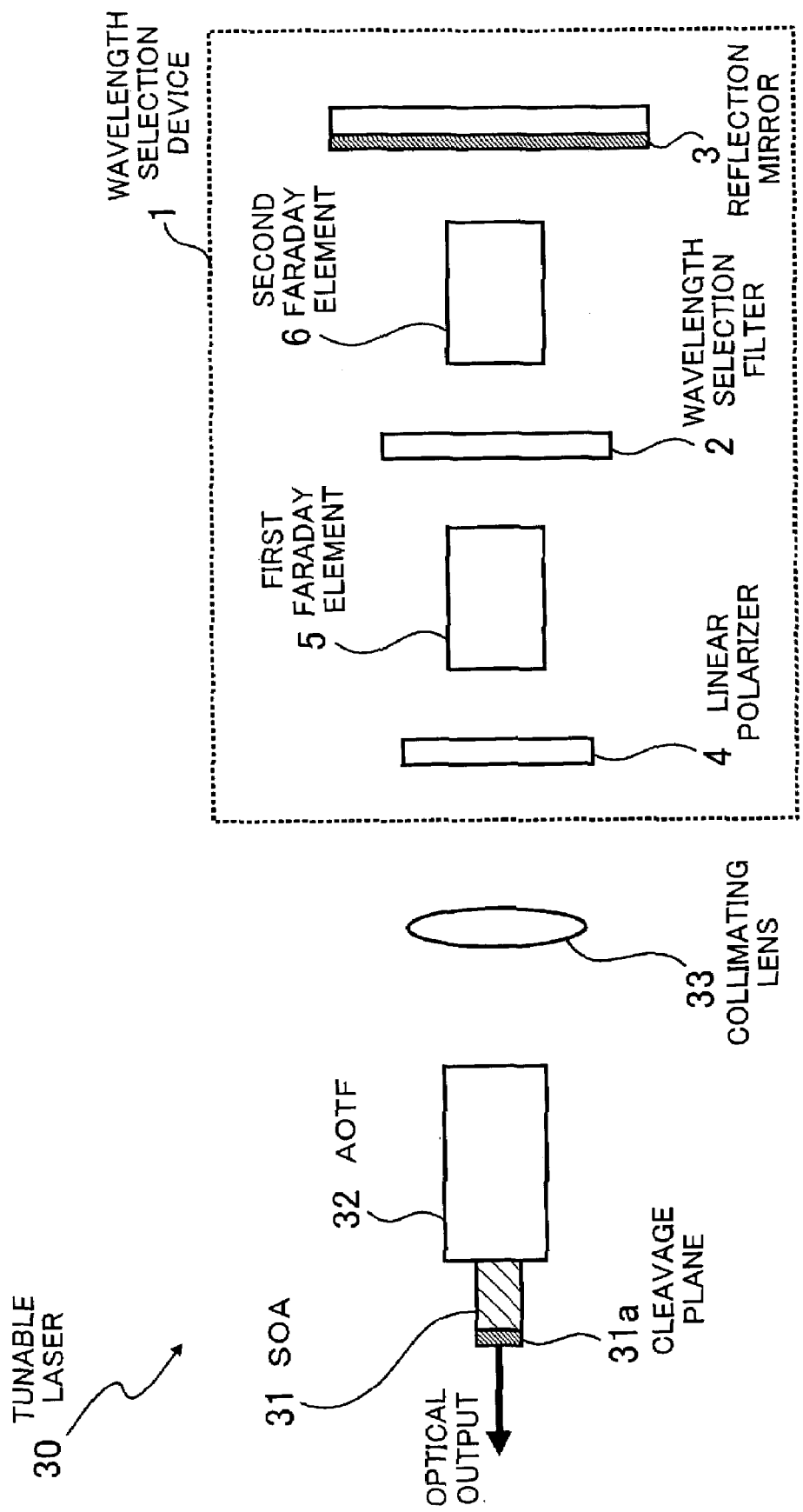
FIG. 6 is a diagram showing an example of the construction of a tunable laser which employs the wavelength selection device according to the first embodiment.

Next, a description will be given of the case in which the wavelength selection device 1 is applied to a tunable laser. FIG. 6 shows an example of the construction of a tunable laser which employs the wavelength selection device according to the first embodiment. It should be noted that in FIG. 6, component parts and elements similar or equivalent to those of the wavelength selection device 1 shown in FIG. 1 are designated by identical reference numerals, and detailed description thereof is omitted.

The tunable laser 30 shown in FIG. 6 includes the wavelength selection device 1. An SOA 31 as a gain medium and an AOTF (Accousto-Optically Tunable Filter) 32 which selectively passes only light of a desired wavelength are arranged in front of the linear polarizer 4 of the wavelength selection device 1. The SOA 31 has an active layer thereof formed by a multiple quantum well, and is arranged such that a gain thereof depends on the polarization direction of light, and a polarization direction in which the gain is maximum coincides with the polarization direction of light transmitted through the linear polarizer 4.

A laser-emitting end face of the SOA 31, that is, an end face on a side where an optical output from the tunable laser 30 is performed is formed as a cleavage plane 31a which serves as a reflection mirror. A resonator is formed between the cleavage plane 31a and the reflection mirror 3 of the wavelength selection device 1. It should be noted that the cleavage plane 31a may be coated with an optical thin film having a specific reflectance.

An end face of the SOA 31 on a side remote from the cleavage plane 31a, and opposite end faces of the AOTF 32 are covered with non-reflection coating. The AOTF 32 is joined to the end face of the SOA 31 on the side opposite to the cleavage plane 31a, e.g. by a butt-joint method.

Further, the tunable laser 30 has a collimating lens 33 arranged between the AOTF 32 and the linear polarizer 4 of the wavelength selection device 1, for optically coupling the AOTF 32 and the wavelength selection device 1. The collimating lens 33 is covered with non-reflection coating.

In the wavelength selection device 1 of the tunable laser 30, an FP etalon is used as the wavelength selection filter 2, and a dielectric multilayer film mirror is used as the reflection mirror 3. Further, the first faraday element 5 and the second faraday element 6 are employed as elements for rotating the polarization.

According to the tunable laser 30 constructed as above, out of light (components) of wavelengths conforming to the ITU-T grid of the filter 2 and transmitted through the same, only one component of a desired wavelength can be selected by the AOTF 32. This makes it possible to cause a narrow-band laser oscillation to occur at an arbitrary, i.e. desired one of the wavelengths of the ITU-T grid. Further, similarly to the wavelength selection laser 20, the tunable laser 30 is made compact in size by using the SOA 31 to use the cleavage plane 31a thereof as a reflection mirror. Further, the use of the SOA 31 having a wide available bandwidth makes it possible to realize the tunable laser 30 which is capable of selecting a wavelength from a wide wavelength range. It should be noted that the tunable filter used in the tunable laser 30 is not limited to the AOTF, but the use of any other suitable tunable filter can also provide the same advantageous effects as provided by the AOTF.

As described hereinabove, the wavelength selection device 1 according to the first embodiment is configured such that the linear polarizer 4 is arranged on the side from which incoming light enters the wavelength selection filter 2 of the wavelength selection device 1, and the first faraday element 5 and the second faraday element 6 each for rotating the polarization by 45 degrees are arranged between the linear polarizer 4 and the wavelength selection filter 2 and between the wavelength selection filter 2 and the reflection mirror 3 that reflects light passing through the wavelength selection filter 2, respectively. Due to this configuration, in the wavelength selection device 1, it is possible to suppress adverse effects of non-selected light reflected from the wavelength selection filter 2 without spoiling the characteristics of the filter 2. Further, it is possible to realize a stable laser oscillation by employing the wavelength selection device 1 constructed as above, in the wavelength selection lasers 10, 20, or the tunable laser 30.

Next, a second embodiment of the present invention will be described hereinafter.

Figure 7:
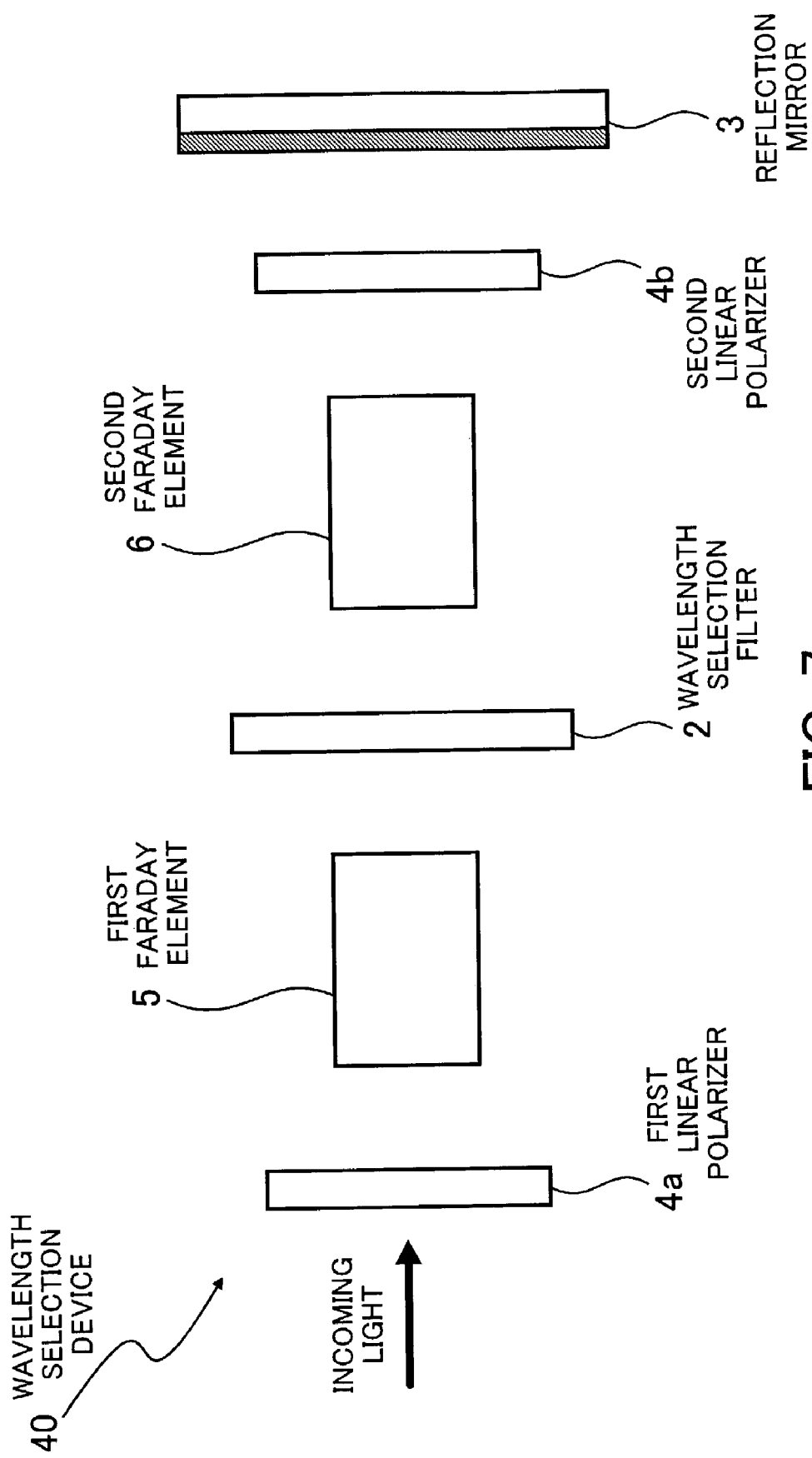
FIG. 7 is a diagram showing the construction of a wavelength selection device according to a second embodiment of the invention.

FIG. 7 shows the construction of a wavelength selection device according to the second embodiment. It should be noted that in FIG. 7, component parts and elements similar or equivalent to those of the wavelength selection device 1 shown in FIG. 1 are designated by identical reference numerals, and detailed description thereof is omitted.

The illustrated wavelength selection device 40 according to the second embodiment includes a wavelength selection filter 2 for passing selected light and reflecting non-selected light, and a reflection mirror 3 for reflecting the selected light having passed through the wavelength selection filter 2. Further, the wavelength selection device 40 includes a first linear polarizer 4a and a first faraday element 5 arranged in front of the wavelength selection filter 2, and a second faraday element 6 and a second linear polarizer 4b arranged rearward of the wavelength selection filter 2 between the filter 2 and the reflection mirror 3. The second linear polarizer 4b is arranged between the second faraday element 6 and the reflection mirror 3 such that the polarization direction thereof is perpendicular to the polarization direction of the first linear polarizer 4a.

That is, the wavelength selection device 40 according to the second embodiment is different from the FIG. 1 wavelength selection device 1 according to the first embodiment only in that the wavelength selection device 40 includes the two linear polarizers, i.e. the first linear polarizer 4a, and the second linear polarizer 4b arranged in the above positional relationship with respect to the first linear polarizer 4a. The wavelength selection devices 40, 10 have the same construction in the other respects.

Similarly to the linear polarizer 4 according to the first embodiment, the first linear polarizer 4a and second linear polarizer 4b of the wavelength selection device 40 according to the second embodiment are each implemented, for instance, by using a Glan-Thompson prism employing a calcite, and allows only components of incoming light having a specific polarization direction to pass therethrough.

Figure 8:
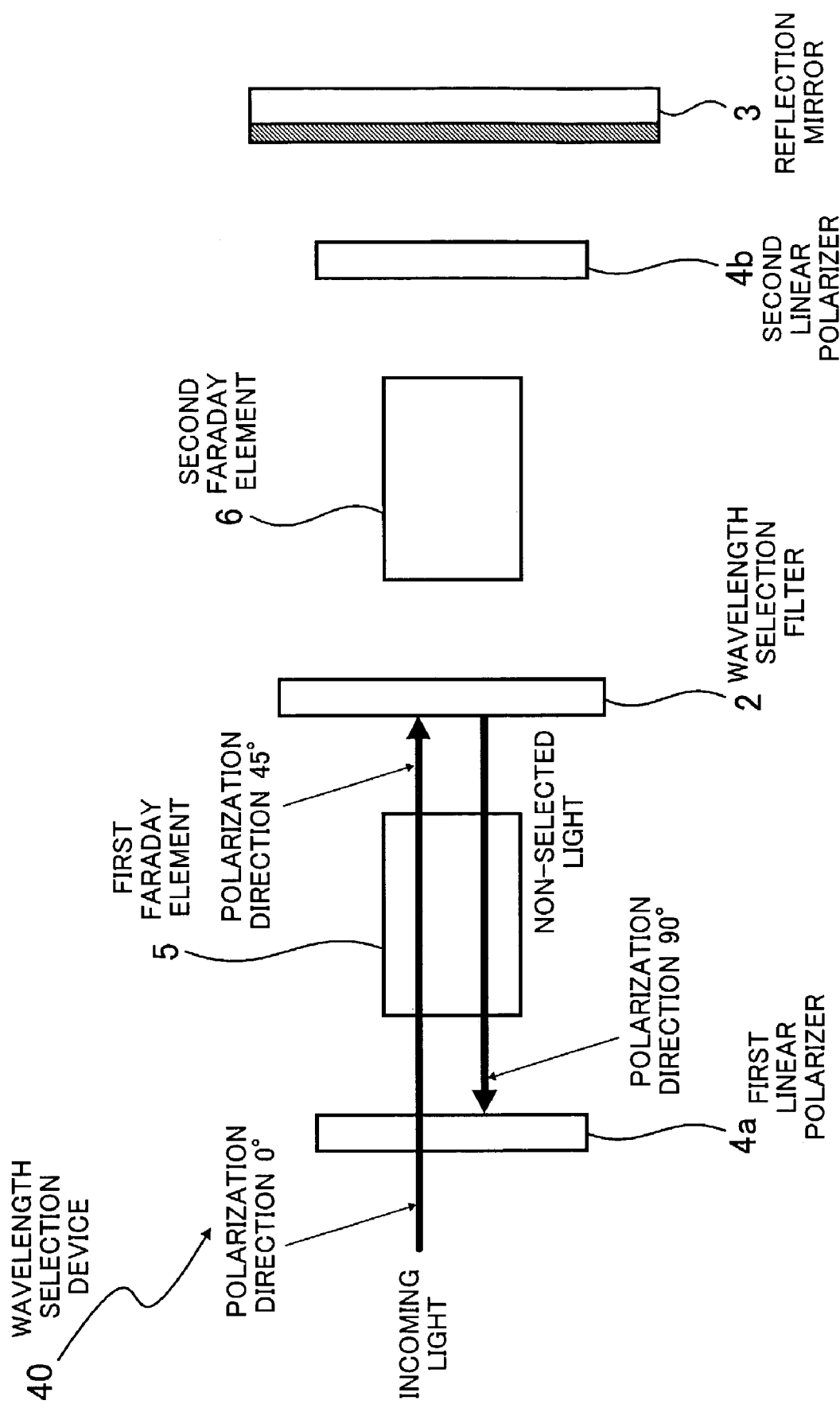
FIG. 8 is a diagram showing a case where light is reflected by a wavelength selection filter, which is useful in explaining the principle of the wavelength selection device according to the second embodiment.
Figure 9:
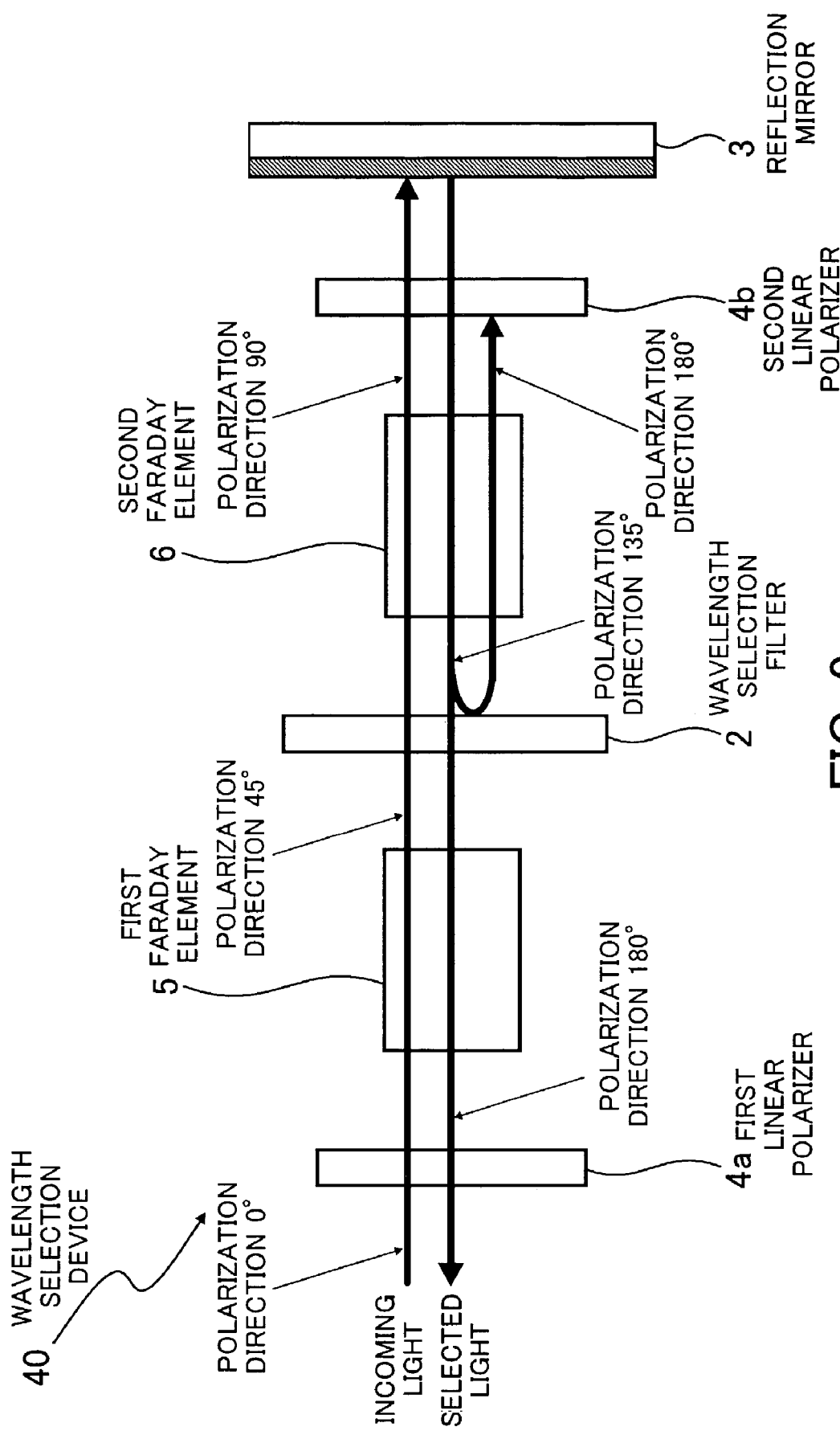
FIG. 9 is a diagram showing a case where light passes through the wavelength selection filter, which is useful in explaining the principle of the wavelength selection device according to the second embodiment.

Now, the principle of suppressing the adverse effects of light reflected from the wavelength selection filter 2 in the wavelength selection device 40 according to the second embodiment will be described with reference to FIGS. 8 and 9. FIG. 8 is a diagram showing a case where light is reflected by the wavelength selection filter, which is useful in explaining the principle of the wavelength selection device according to the second embodiment. FIG. 9 is a diagram showing a case where light passes through the wavelength selection filter, which is useful in explaining the principle of the wavelength selection device according to the second embodiment.

First, the wavelength selection device 40 is configured such that incoming light is in the form of linearly polarized light and the polarization direction of the linearly polarized light coincides with the polarization direction of the first linear polarizer 4a. As shown in FIG. 8, light of wavelengths to be reflected by the wavelength selection filter 2, i.e. the non-selected light, is reflected by the wavelength selection filter 2 after having passed through the first faraday element 5, and passes through the first faraday element 5 again, to reach the first linear polarizer 4a. In the meantime, the light reflected by the wavelength selection filter 2 passes through the faraday element for rotating the polarization 45 degrees twice, and hence the polarization of the non-selected light is rotated through 90 degrees before it returns to the first linear polarizer 4a. Therefore, the non-selected light is blocked by the first linear polarizer 4a.

On the other hand, as shown in FIG. 9, out of light having passed through the first linear polarizer 4a, light of wavelengths allowed to pass through the wavelength selection filter 2, i.e. the selected light, passes through the first faraday element 5, the wavelength selection filter 2, and the second faraday element 6, in the mentioned order, to reach the second linear polarizer 4b. In the meantime, the light having passed through the wavelength selection filter 2 has passed through the faraday element twice. Therefore, the polarization of the light is rotated by 90 degrees, and hence the light can pass through the second linear polarizer 4b having a polarization direction perpendicular to that of the first linear polarizer 4a. The selected light, after having passed through the second linear polarizer 4b, is reflected by the reflection mirror 3, passes through the second linear polarizer 4b again, and reaches the wavelength selection filter 2 after passing though the second faraday element 6.

Here, there is sometimes a case in which a further selection of wavelength occurs due to the characteristics of the wavelength selection filter 2, so that some part passes through the filter 2 whereas the other part is reflected by the filter 2. In such a case, there can occur multiple reflection between the wavelength selection filter 2 and the reflection mirror 3, resulting in the degradation of the characteristics of the filter 2.

In the wavelength selection device 40 according to the second embodiment, the selected light transmitted through the wavelength selection filter 2 from the side of the reflection mirror 3 passes through the first faraday element 5, and reaches the first linear polarizer 4a. In this case, since the selected light has passed through the faraday element four times in total before it returns to the first linear polarizer 4a, the polarization of the selected light has been rotated through 180 degrees, so that the selected light can pass through the first linear polarizer 4a. On the other hand, the part of the selected light, reflected toward the reflection mirror 3 by the wavelength selection filter 2 passes through the second faraday element 6 to reach the second linear polarizer 4b. In this case, the reflected part of the light has passed through the faraday element four times in total before it returns to the second linear polarizer 4b, so that the polarization of the reflected part of the light has been rotated through 180 degrees, and hence the reflected part of the light is blocked by the second linear polarizer 4b. This makes it possible to prevent the multiple reflection between an end face of the wavelength selection filter 2 toward the reflection mirror 3 and the reflection mirror 3, thereby making it possible to prevent the degradation of the characteristics of the filter 2.

As described hereinabove, by arranging the second linear polarizer 4b between the second faraday element 6 and the reflection mirror 3, it is possible to accurately take out selected light and not to take out non-selected light, while preventing multiple reflection from occurring within the wavelength selection device 40.

Figure 10:
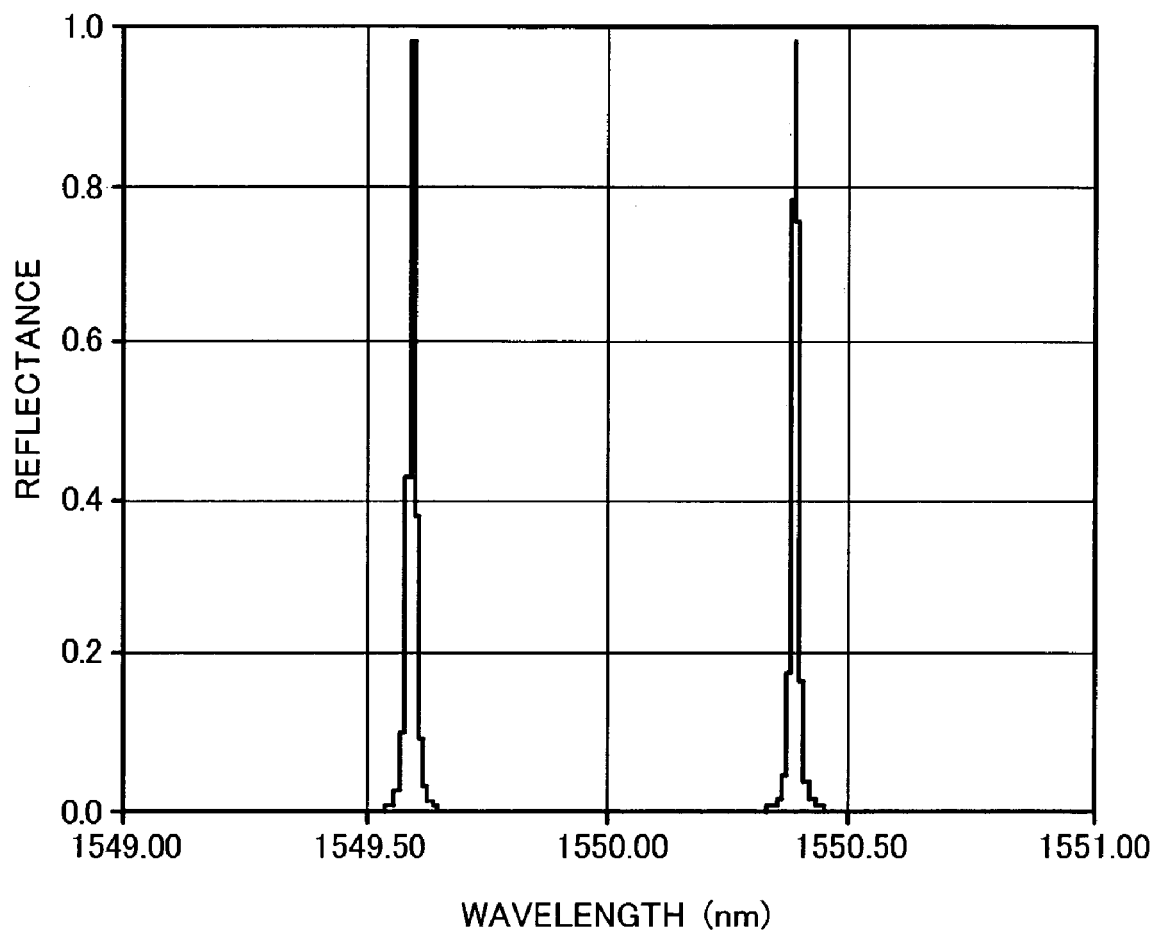
FIG. 10 is a diagram showing an example of a reflection spectrum calculated of the wavelength selection device according to the second embodiment.

FIG. 10 shows an example of a reflection spectrum calculated of the wavelength selection device according to the second embodiment. In FIG. 10, the abscissa represents wavelengths (nm), while the ordinate represents reflectance. As shown in FIG. 10, the wavelength selection device 40 gives very sharp reflection peaks at wavelengths passing through the wavelength selection filter 2, and hence has excellent filter characteristics. It can be said that in the wavelength selection device 40, adverse effects of reflection by the wavelength selection filter 2 and multiple reflection between the wavelength selection filter 2 and the reflection mirror 3 are properly suppressed.

Further, similarly to the case of the first embodiment, even if the second linear polarizer 4b is inserted onto an optical axis, if optimum faraday elements are used and arranged in an optimal fashion, it is possible to reduce the whole insertion loss of the device to a small value of approximately 0.7 dB in one way.

Next, a description will be given of cases in which the wavelength selection device 40 constructed in accordance with the above principle is applied to a wavelength selection laser and a tunable laser.

Figure 11:
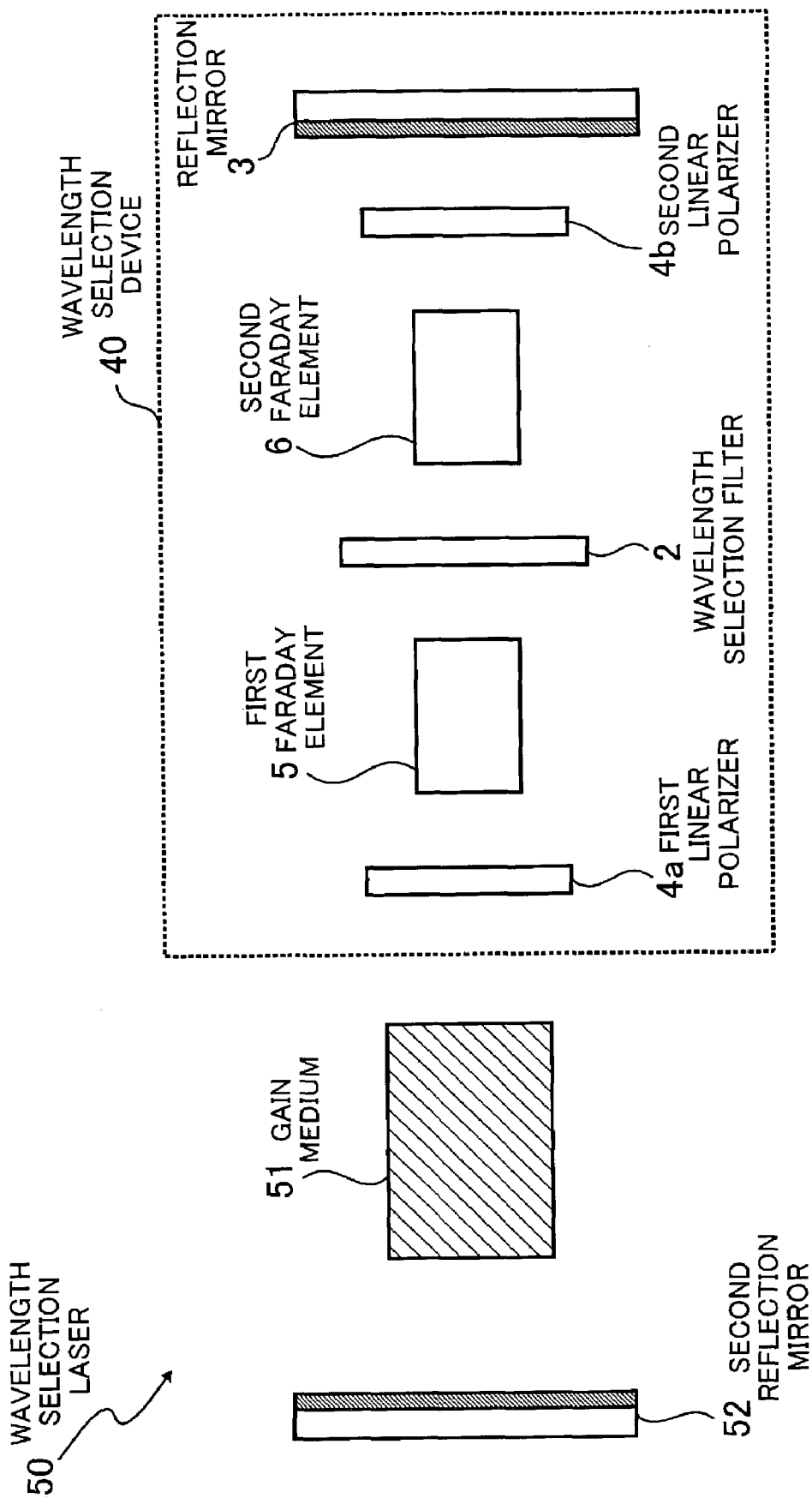
FIG. 11 is a conceptual representation of a wavelength selection laser which employs the wavelength selection device according to the second embodiment.

First, the case will be described in which the wavelength selection device 40 is applied to a wavelength selection laser. FIG. 11 is a conceptual representation of the wavelength selection laser which employs the wavelength selection device according to the second embodiment. It should be noted that in FIG. 11, component parts and elements similar or equivalent to those of the wavelength selection devices shown in FIGS. 1 and 7 are designated by identical reference numerals, and detailed description thereof is omitted.

The wavelength selection laser 50 shown in FIG. 11 includes the wavelength selection device 40, a gain medium 51 arranged in front of the first linear polarizer 4a of the wavelength selection device 40, and a second reflection mirror 52 arranged on a side remote from the first linear polarizer 4a with respect to the gain medium 51. A resonator is formed between the second reflection mirror 52 and the reflection mirror 3 of the wavelength selection device 40.

In the wavelength selection laser 50 constructed as above, out of light emitted from the gain medium 51, light of desired wavelengths is selected by the wavelength selection filter 2. The light of the desired wavelengths is resonated between the second reflection mirror 52 and the reflection mirror 3 of the wavelength selection device 40, and then lasing occurs. In this process, in the wavelength selection device 40, it is possible to suppress adverse effects of light reflected from the wavelength selection filter 2 and multiple reflection within the device 40, thereby making it possible to cause an accurate and stable laser oscillation to occur at the wavelengths selected by the wavelength selection device 40.

Figure 12:
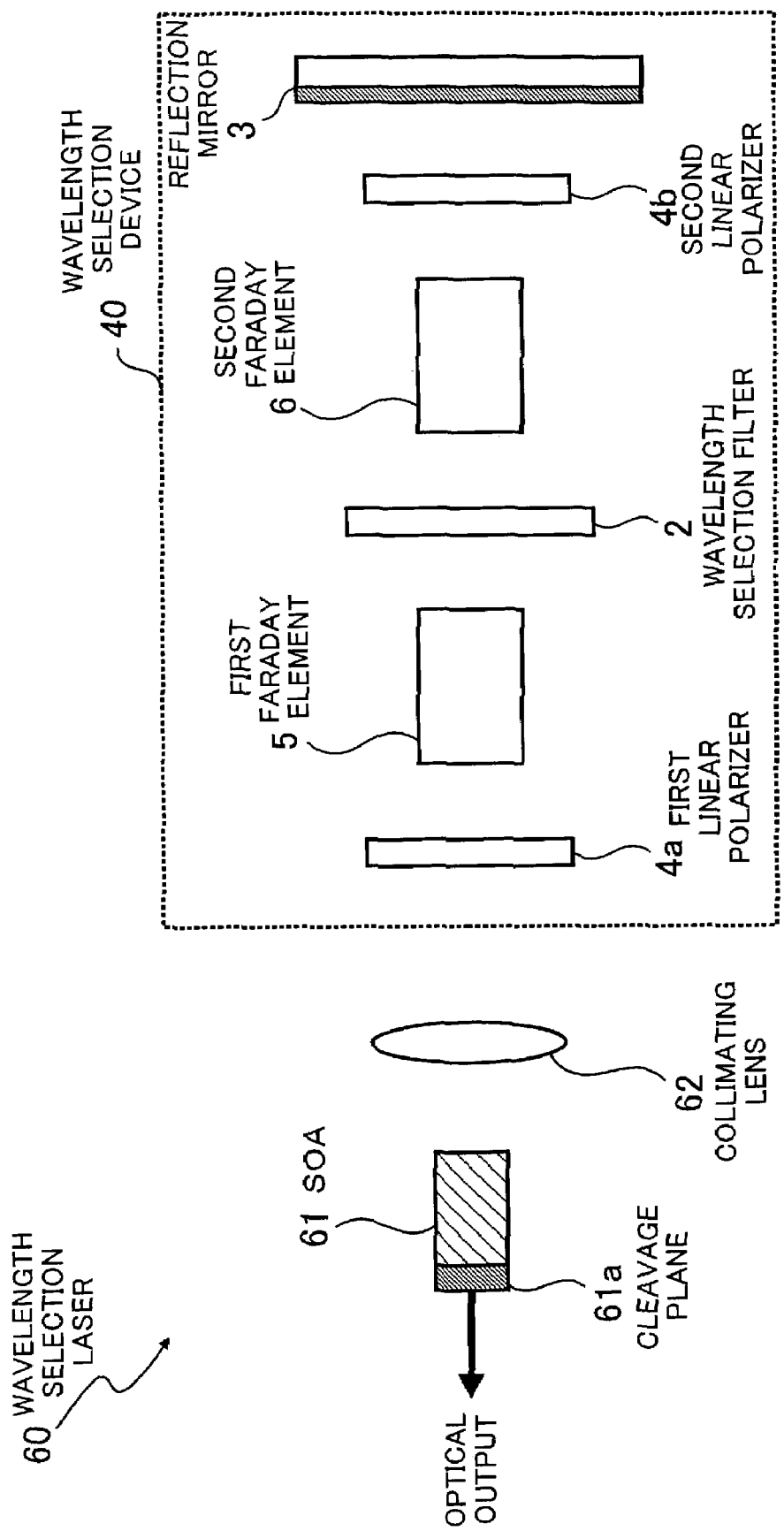
FIG. 12 is a diagram showing an example of the construction of a wavelength selection laser which employs the wavelength selection device according to the second embodiment.

FIG. 12 shows an example of the construction of a wavelength selection laser which employs the wavelength selection device according to the second embodiment. The wavelength selection laser 60 shown in FIG. 12 includes the wavelength selection device 40. An SOA 61, as a gain medium, is arranged in front of the first linear polarizer 4a. The SOA 61 has an active layer thereof formed by a multiple quantum well, and is arranged such that a gain thereof depends on the polarization direction of light, and a polarization direction of light at which the gain is maximum coincides with the polarization direction of light passing through the first linear polarizer 4a. Further, a collimating lens 62 is arranged between the SOA 61 and the first linear polarizer 4a, for optically coupling the SOA 61 and the wavelength selection device 40.

Out of the end faces of the SOA 61, an end face on a side where an optical output from the wavelength selection laser 60 is performed is formed with a cleavage plane 61a which serves as a reflection mirror. A resonator is formed between the cleavage plane 61a and the reflection mirror 3 of the wavelength selection device 40. It should be noted that the cleavage plane 61a may be coated with an optical thin film having a specific reflectance. Further, the other of the end faces of the SOA 61 toward the wavelength selection device 40 and the collimating lens 62 are covered with non-reflection coating.

According to the wavelength selection laser 60 constructed as above, it is possible to suppress multiple reflection within the wavelength selection device 40 and resonate only light of wavelengths selected by the wavelength selection filter 2. This makes it possible to realize a wavelength selection laser which is capable of lasing only light of wavelengths conforming to the ITU-T grid of the wavelength selection filter 2. Further, when the SOA 61 is used, a wide available gain bandwidth thereof enables laser oscillation to be caused over a wide wavelength range.

Figure 13:
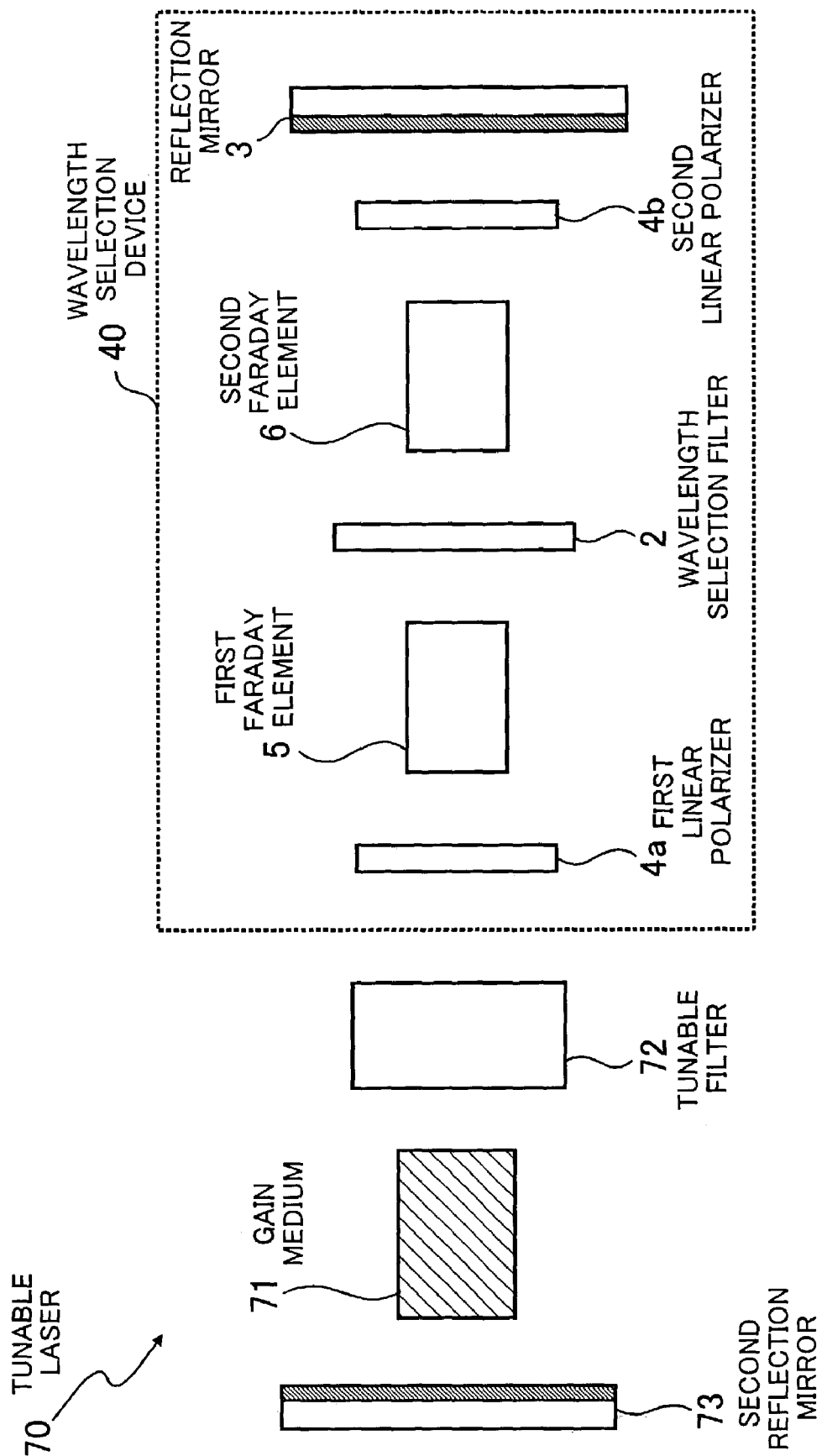
FIG. 13 is a conceptual representation of a tunable laser which employs the wavelength selection device according to the second embodiment.

Next, the case will be described in which the wavelength selection device 40 is applied to a tunable laser. FIG. 13 is a conceptual representation of a tunable laser which employs the wavelength selection device according to the second embodiment. It should be noted that in FIG. 13, component parts and elements similar or equivalent to those of the wavelength selection devices shown in FIGS. 1 and 7 are designated by identical reference numerals, and detailed description thereof is omitted.

The tunable laser 70 shown in FIG. 13 has a tunable filter 72, such as an AOTF or the like, between the wavelength selection device 40 and a gain medium 71 arranged in front of the first linear polarizer 4a of the wavelength selection device 40. Further, the tunable laser 70 includes a second reflection mirror 73 arranged on a side remote from the tunable filter 72 with respect to the gain medium 71, and a resonator is formed between the second reflection mirror 73 and the reflection mirror 3 of the wavelength selection device 40.

In the tunable laser 70 constructed as above, it is possible to suppress not only adverse effects of light reflected from the wavelength selection filter 2 of the wavelength selection device 40 but also multiple reflection within the device 40. This makes it possible to cause an accurate and stable laser oscillation to occur at a desired one of a plurality of wavelengths selected by the wavelength selection device 40.

Figure 14:
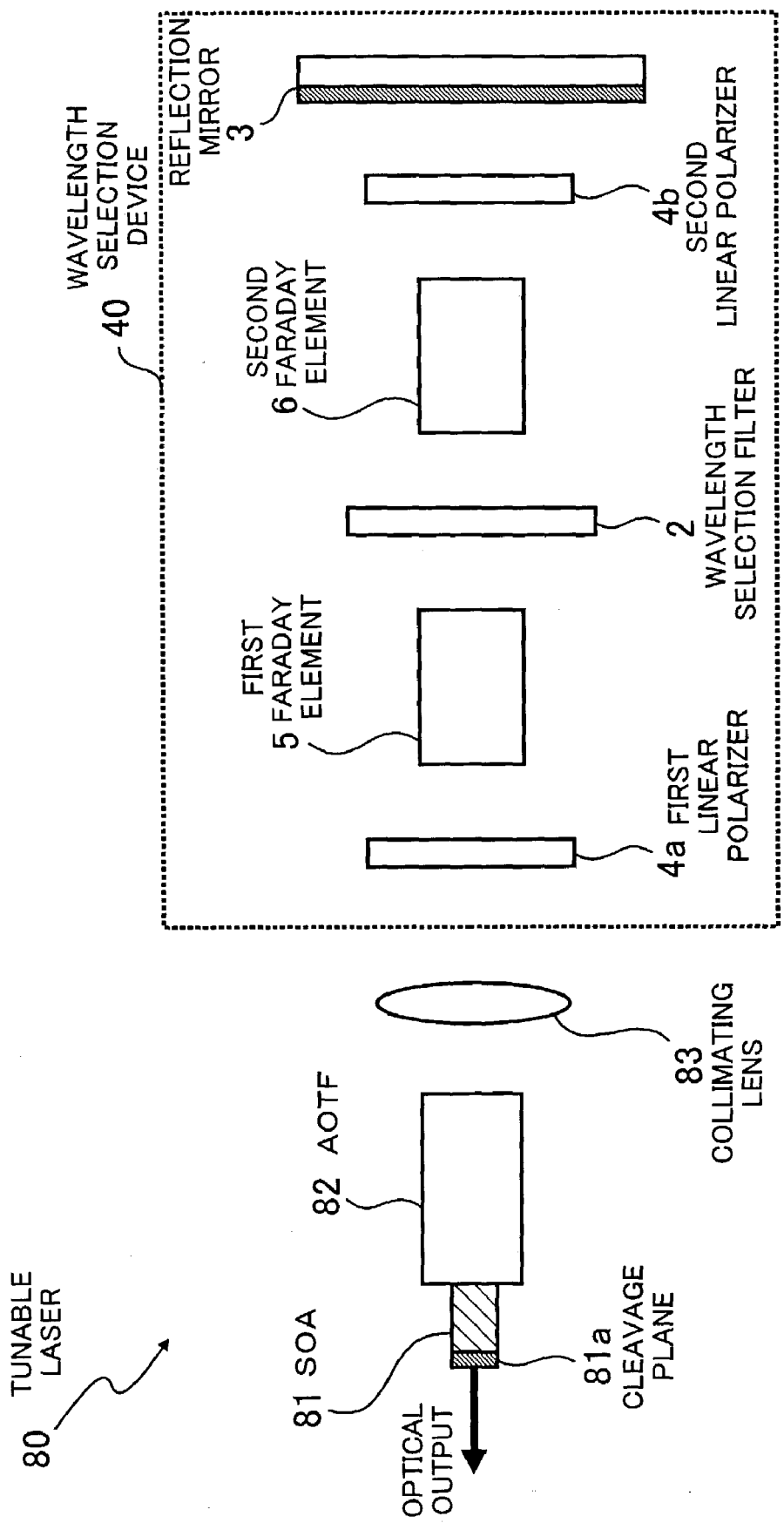
FIG. 14 is a diagram showing an example of the construction of the tunable laser which employs the wavelength selection device according to the second embodiment.

FIG. 14 is a diagram showing an example of the construction of a tunable laser which employs the wavelength selection device according to the second embodiment. The tunable laser 80 shown in FIG. 14 includes the wavelength selection device 40, and an SOA 81 and an AOTF 82 are arranged in front of the first linear polarizer 4a of the wavelength selection device 40. A laser-emitting end face of the SOA 81 is formed as a cleavage plane 81a. A resonator is formed between the cleavage plane 81a and the reflection mirror 3.

The AOTF 82 is joined to an end face of the SOA 81 on a side remote from the cleavage plane 81a, by a butt-joint method. A collimating lens 83 is arranged between the AOTF 82 and the first linear polarizer 4a such that rays of light emitted from the AOTF 82 enter the wavelength selection filter 2 in parallel with the optical axis. It should be noted that in the tunable laser 80, the end face of the SOA 81 on the side opposite to the cleavage plane 81a, opposite end faces of the AOTF 82, and the collimating lens 83 are covered with non-reflection coating. Further, the cleavage plane 81a may be coated with an optical thin film having a specific reflectance.

According to the tunable laser 80 constructed as above, from components of light, which are permitted to pass through the wavelength selection filter 2 due to their wavelengths conforming to the ITU-T grid of the filter 2, only one component of a desired wavelength can be selected by the AOTF 82. This makes it possible to cause a narrow-band laser oscillation to occur at a desired one of the wavelengths of the ITU-T grid. Further, when the AOTF 82 is used as a tunable filter, due to a wide wavelength coverage and a very high operating speed of 1 mm/sec or less of the AOTF 82, it is possible to realize a tunable laser which is capable of carrying out wavelength-varying operation over a wide wavelength range at a very high operating speed. It should be noted that the tunable filter used in the tunable laser 80 is not limited to the AOTF 82, but it is possible to obtain the same advantageous effects as provided by the AOTF 82 by using any other suitable tunable filter. Further, in FIG. 14, the SOA 81 and the AOTF 82 may be reversed in position with respect to each other.

As described hereinabove, the wavelength selection device 40 according to the second embodiment is configured such that the linear polarizer 4 of the wavelength selection device 1 according to the first embodiment is used as the first linear polarizer 4a, and the second linear polarizer 4b whose polarization direction is perpendicular to the polarization direction of the first linear polarizer 4a is arranged between the second faraday element 6 and the reflection mirror 3. This makes it possible to suppress not only adverse effects of non-selected light reflected from the wavelength selection filter 2 without spoiling the characteristics of the filter 2 but also multiple reflection between the filter 2 and the reflection mirror 3. Further, by employing the wavelength selection device 40 constructed as above in the wavelength selection lasers 50, 60, or the tunable lasers 70, 80, it is possible to realize an accurate and stable laser oscillation by suppressing adverse effects of non-selected light.

Next, a third embodiment of the present invention will be described hereinafter.

Figure 15:
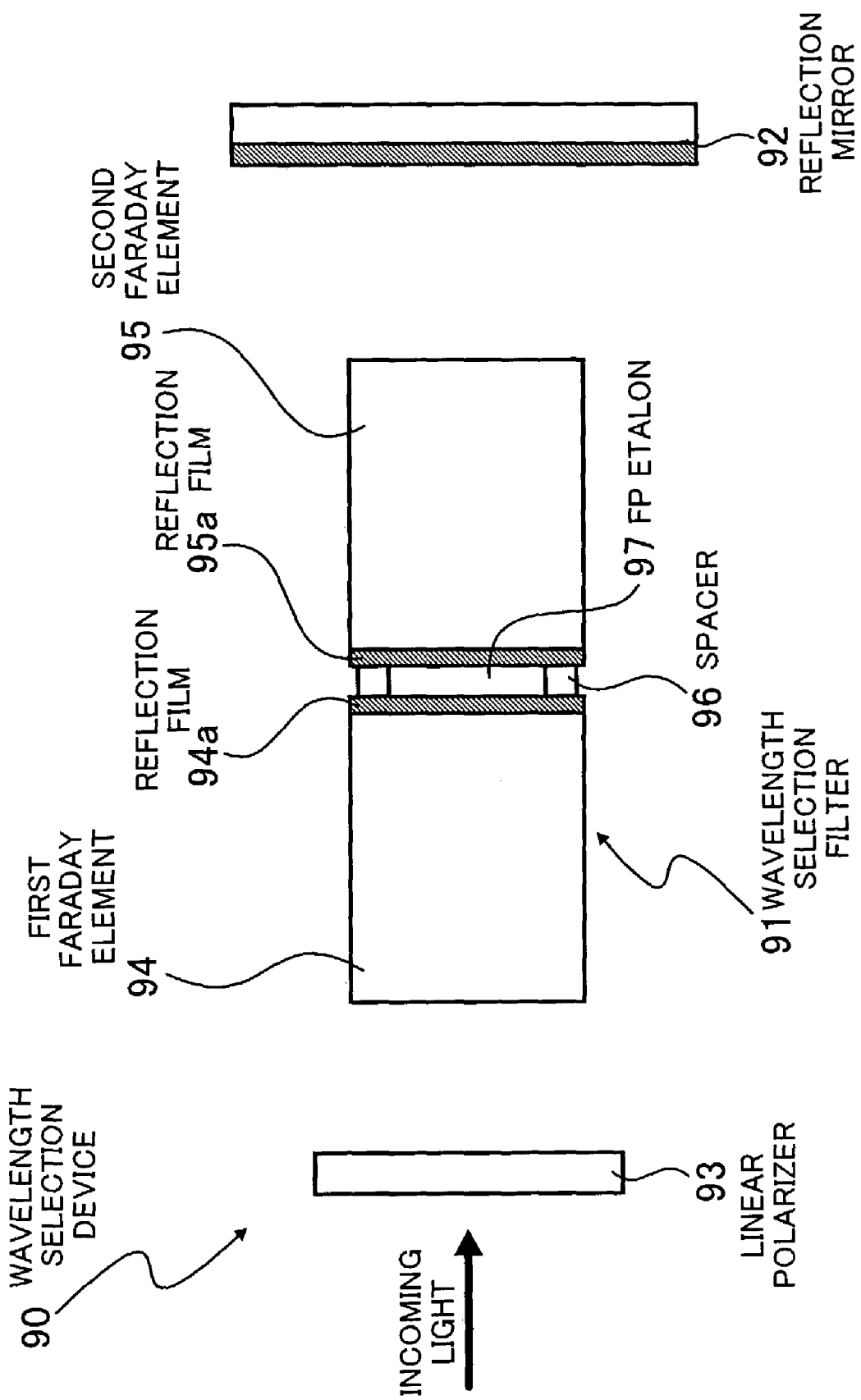
FIG. 15 is a diagram showing an example of the construction of a wavelength selection device according to a third embodiment.

FIG. 15 shows an example of the construction of a wavelength selection device according to the third embodiment. The wavelength selection device 90 constructed as shown in FIG. 15 includes a wavelength selection filter 91 for passing selected light but reflecting non-selected light. At the rear of the wavelength selection filter 91, that is, on a side toward which light entering the wavelength selection device 90 passes through the wavelength selection filter 91 to emit therefrom is arranged a reflection mirror 92 for reflecting selected light having passed through the wavelength selection filter 91. Further, in front of the wavelength selection filter 91, that is, on a side from which the incoming light enters the wavelength selection device 90 is arranged a linear polarizer 93.

The wavelength selection filter 91 is configured such that a first faraday element 94 and a second faraday element 95, each for rotating the polarization by 45 degrees, are fixedly arranged on opposite sides of a spacer 96 in a state where opposed end faces thereof are parallel to each other. The first faraday element 94 and the second faraday element 95 are formed with reflection films 94a, 95a on the opposed end faces thereof, respectively. A gap between the first faraday element 94 and the second faraday element 95 is adjusted to a predetermined length by the spacer 96. Due to this configuration, in the wavelength selection filter 91, an air gap FP etalon 97, which uses reflection of light by the reflection films 94a, 95a formed on the end faces of the first faraday element 94 and the second faraday element 95, is integrally formed with the first faraday element 94 and the second faraday element 95. It should be noted that an end face of the first faraday element 94 toward the linear polarizer 93, and an end face of the second faraday element 95 toward the reflection mirror 92 are each covered with non-reflection coating.

In the wavelength selection device 90 having the component parts and elements arranged as above, as the first faraday element 94 and the second faraday element 95, there are employed faraday elements which are formed by magnetic garnet crystal, and designed to rotate the polarization by 45 degrees. Further, the respective reflection films 94a, 95a formed on the first faraday element 94 and the second faraday element 95 are dielectric multilayer films designed to have an end face reflectance of approximately 80% with respect to light of a wavelength band of 1.55 µm, for instance. Furthermore, the first and second faraday elements 94, 95 are rigidly fixed to each other via the spacer 96 made of quartz having a thickness of 1.5 mm such that the end faces coated with the reflection films 94a, 95a are parallel to each other with a gap of 1.5 mm. To rigidly fix the first and second faraday elements 94, 95, an adhesive e.g. composed of resin is used. More specifically, the adhesive is thickly applied to portions exposed outward when the spacer 96, the first faraday element 94, and the second faraday element 95 are joined or abutted to each other, whereby the components are rigidly fixed in a state joined to each other. The gap of 1.5 mm held by the spacer 96, and the reflection films 94a, 95a having an end face reflectance of 80% construct the air gap FP etalon 97 whose wavelength interval (free spectrum range) of light allowed to pass therethrough conform to the 100 GHz ITU-T grid in the wavelength band of 1.55 µm.

The reflection mirror 92 is formed e.g. by a dielectric multilayer film, and designed to have a reflectance of 99% or more with respect to light within a wavelength range of 1.52 to 1.62 µm. The linear polarizer 93 is implemented by a Glan-Thompson prism using calcite, for instance, such that it passes only components of incident light having a specific polarization direction.

Now, a description will be given of the principle of suppressing adverse effects of non-selected light in the wavelength selection device 90 according to the third embodiment. First, as incident light entering the wavelength selection device 90, there is used linearly polarized light having the polarization direction coincident with the polarization direction of the linear polarizer 93. Out of the incident light having passed through the linear polarizer 93, components (light) of wavelengths allowed to pass through the FP etalon 97 pass through the first faraday element 94, the FP etalon 97, and the second faraday element 95, in the mentioned order, to reach the reflection mirror 92. Then, the components (light) reflected by the reflection mirror 92 pass through the second faraday element 95, the FP etalon 97, and the first faraday element 94, to return to the linear polarizer 93. In the meantime, the light of the wavelengths allowed to pass through the FP etalon 97 has passed through the first faraday element 94 twice, and the second faraday element 95 twice. That is, the selected light has passed through the faraday element four times in total. Therefore, the polarization of the selected light passing through the FP etalon 97 has been rotated through 180 degrees before the selected light returns to the linear polarizer 93 again after passing through the same, and hence the selected light can pass through the linear polarizer 93.

On the other hand, the light (components) of wavelengths to be reflected by the FP etalon 97 is reflected by the FP etalon 97 after having passed through the first faraday element 94, and passes through the first faraday element 94 again, to return to the linear polarizer 93. In the meantime, the light of the wavelengths to be reflected by the FP etalon 97, that is, non-selected light, has passed through the first faraday element 94 twice in total, so that the polarization of the non-selected light has been rotated through 90 degrees before the non-selected light returns to the linear polarizer 93. Therefore, the non-selected light is blocked by the linear polarizer 93.

As described above, in the wavelength selection device 90 constructed as above, selected light to be transmitted through the FP etalon 97 is taken out, but non-selected light to be reflected by the FP etalon 97 is not taken out. This makes it possible to suppress adverse effects of non-selected light when laser oscillation is caused to occur by using the wavelength selection device 90. Further, since light can be caused to enter the FP etalon 97 perpendicularly thereto, it is possible to take out light of desired wavelengths without spoiling the characteristics of the FP etalon 97, such as finesses thereof.

Further, in the wavelength selection device 90, by configuring the wavelength selection filter 91 such that the first and second faraday elements 94, 95 for rotating the polarization by 45 degrees are integrally formed with the FP etalon 97, it is possible to make the whole wavelength selection device 90 compact in size. Further, by forming the wavelength selection filter 91 as a unitary member, it is possible to reduce the number of components required for assembly of the wavelength selection device 90, whereby the assembly and alignment of the components can be made easy and simple to carry out.

Figure 16:
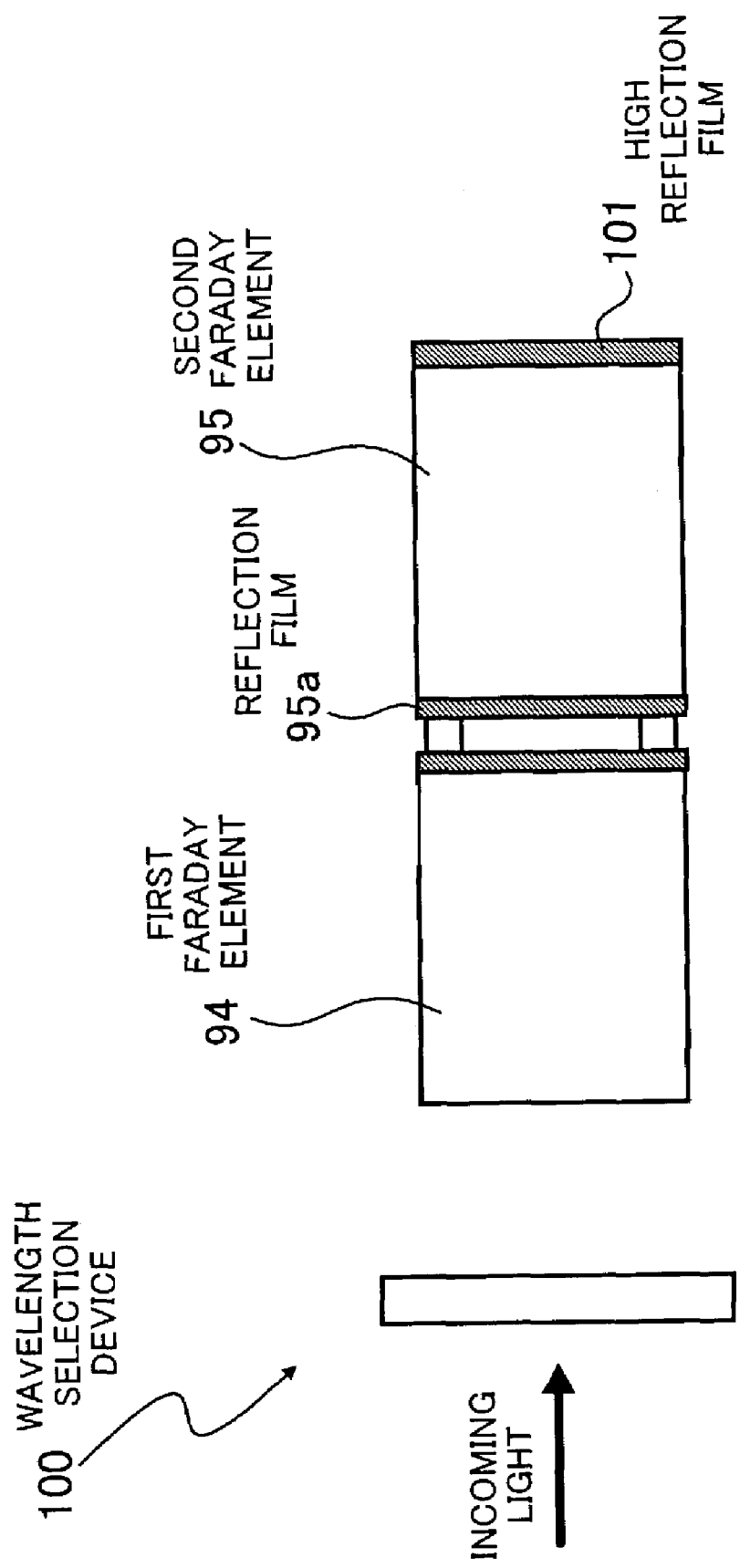
FIG. 16 is a diagram showing a first variation of the wavelength selection device according to the third embodiment.
Figure 17:
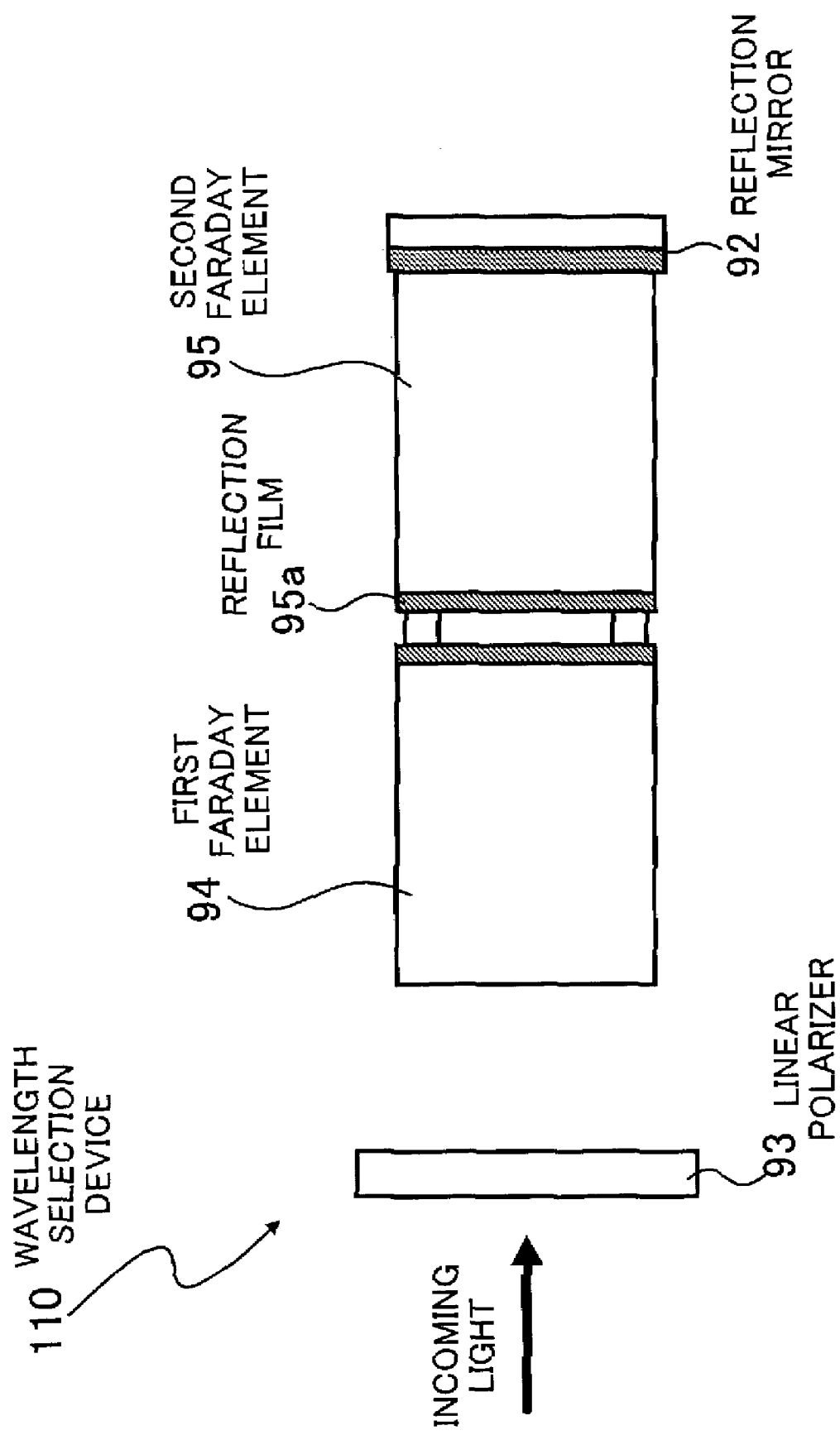
FIG. 17 is a diagram showing a second variation of the wavelength selection device according to the third embodiment.
Figure 18:
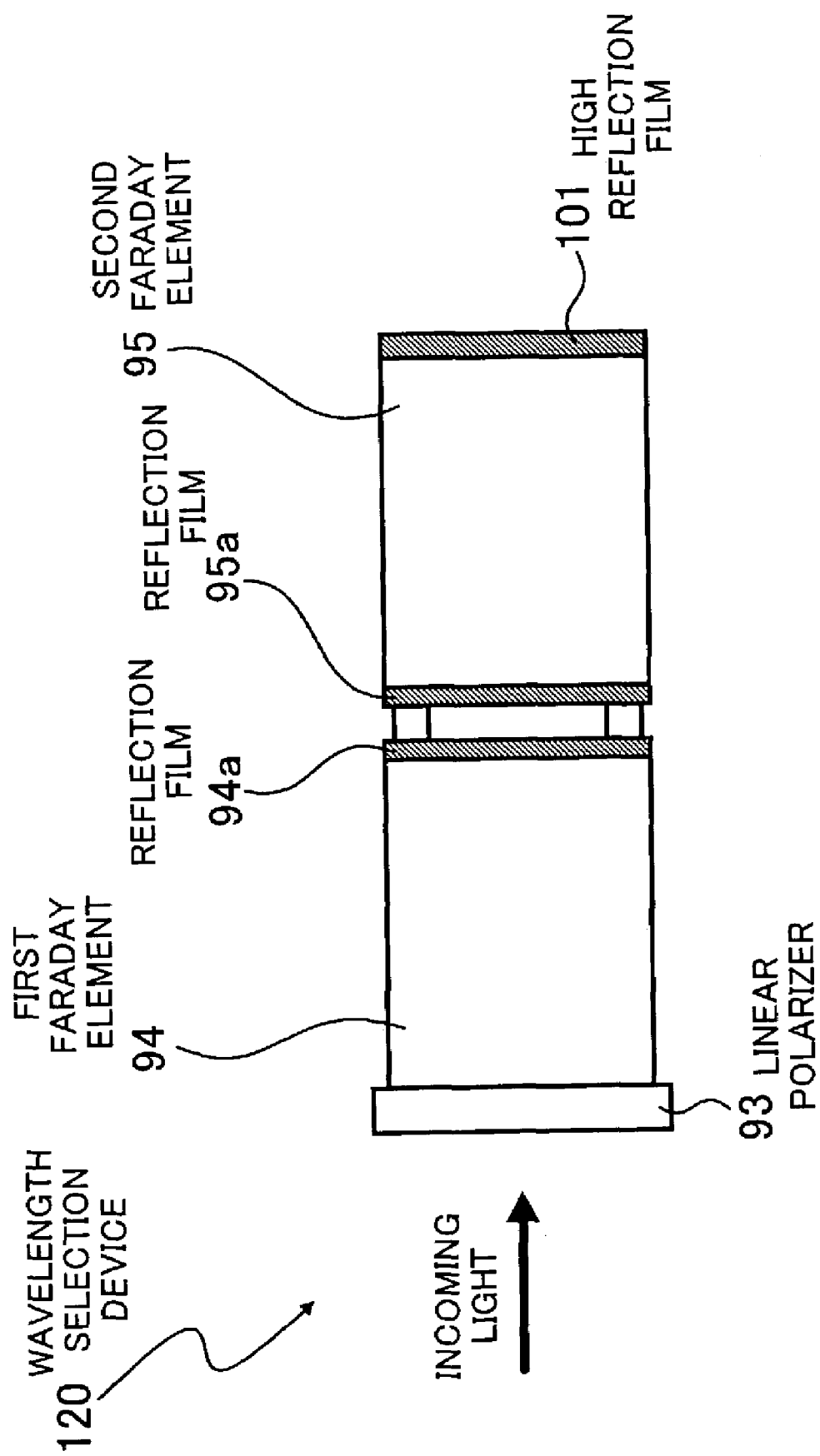
FIG. 18 shows a third variation of the wavelength selection device according to the third embodiment.

In addition to the construction shown in FIG. 15, the wavelength selection device according to the third embodiment can be constructed as illustrated by way of example in FIGS. 16 to 18 as first to third variations thereof. It should be noted that in FIGS. 16 to 18, component parts and elements similar or equivalent to those of the wavelength selection device shown in FIG. 15 are designated by identical reference numerals, and detailed description thereof is omitted.

FIG. 16 shows the first variation of the wavelength selection device according to the third embodiment. A wavelength selection device 100 according to the first variation is distinguished from the FIG. 15 wavelength selection device 90 in that in place of the reflection mirror 92 appearing in FIG. 15, a high reflection film 101 is formed on an end face of the second faraday element 95 on a side remote from the reflection film 95a. The other component parts and the principle of the device are the same as those of the wavelength selection device 90 in FIG. 15. The high reflection film 101 can be formed by a dielectric multilayer film designed to have an end face reflectance of approximately 99% with respect to light within a wavelength range of 1.52 to 1.62 µm, for instance. This high reflection film 101 plays the same role as the reflection mirror 92 in FIG. 15. If the wavelength selection device is constructed as above, it is possible to dispense with the reflection mirror 92. Therefore, the wavelength selection device 100 can be made more compact in size than the FIG. 15 wavelength selection device 90, and it becomes no longer necessary to effect alignment of the reflection mirror 92.

FIG. 17 shows the second variation of the wavelength selection device according to the third embodiment. A wavelength selection device 110 according to the second variation is distinguished from the FIG. 15 wavelength selection device 90 in that the reflection mirror 92 is affixed to the end face of the second faraday element 95 on the side opposite to the reflection film 95*a*. The other component parts and the principle of the device are the same as those of the wavelength selection device 90 in FIG. 15. The reflection mirror 92 is affixed to the second faraday element 95 by applying an adhesive e.g. composed of resin to portions exposed outward when the reflection mirror 92 and the second faraday element 95 are joined to each other. Similarly to the first variation, in the second variation constructed as above, it is possible to make the device compact in size and make the alignment of components of the device easy to carry out.

FIG. 18 shows the third variation of the wavelength selection device according to the third embodiment. A wavelength selection device 120 according to the third variation is distinguished from the FIG. 15 wavelength selection device 90 in that the high reflection film 101 is formed on the end face of the second faraday element 95 on the side remote from the reflection film 95*a*, and the linear polarizer 93 is affixed to an end face of the first faraday element 94 on a side remote from the reflection film 94*a*. The other component parts and the principle of the device are the same as those of the wavelength selection device 90 in FIG. 15. The linear polarizer 93 is affixed to the first faraday element 94 by applying an adhesive e.g. composed of resin to portions exposed outward when the linear polarizer 93 and the first faraday element 94 are joined to each other. If the wavelength selection device is constructed as above, it is possible to make the device more compact in size. It should be noted that similarly to the wavelength selection device 120 shown in the third variation, the FIG. 16 and FIG. 17 wavelength selection device 100, 110 can be configured such that the linear polarizer 93 is affixed to the first faraday element 94.

Further, the FIG. 15 wavelength selection device 90 can be configured such that the spacer 96 of the wavelength selection filter 91 is formed by using a material whose volume is varied with temperature, or a piezoelectric element. If the wavelength selection device is configured such that the gap between the first faraday element 94 and the second faraday element 95 can be controlled by temperature or voltage, it is possible to form the wavelength selection filter 91 as a tunable filter which is capable of changing wavelengths allowed to pass therethrough.

Figure 19:
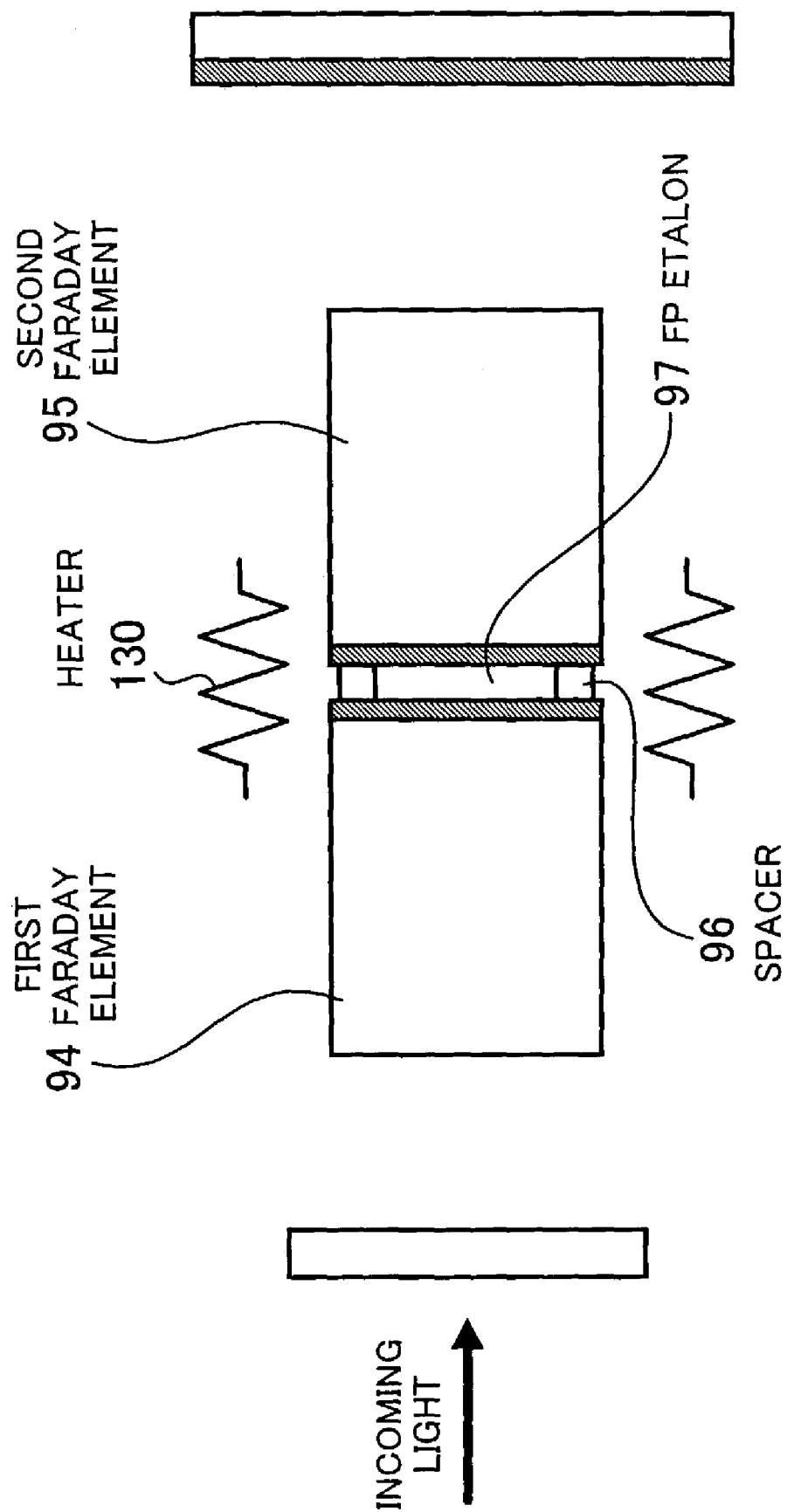
FIG. 19 is a diagram showing an example of the construction of a wavelength selection device in which a gap between a first faraday element and a second faraday element is controlled by temperature.
Figure 20:
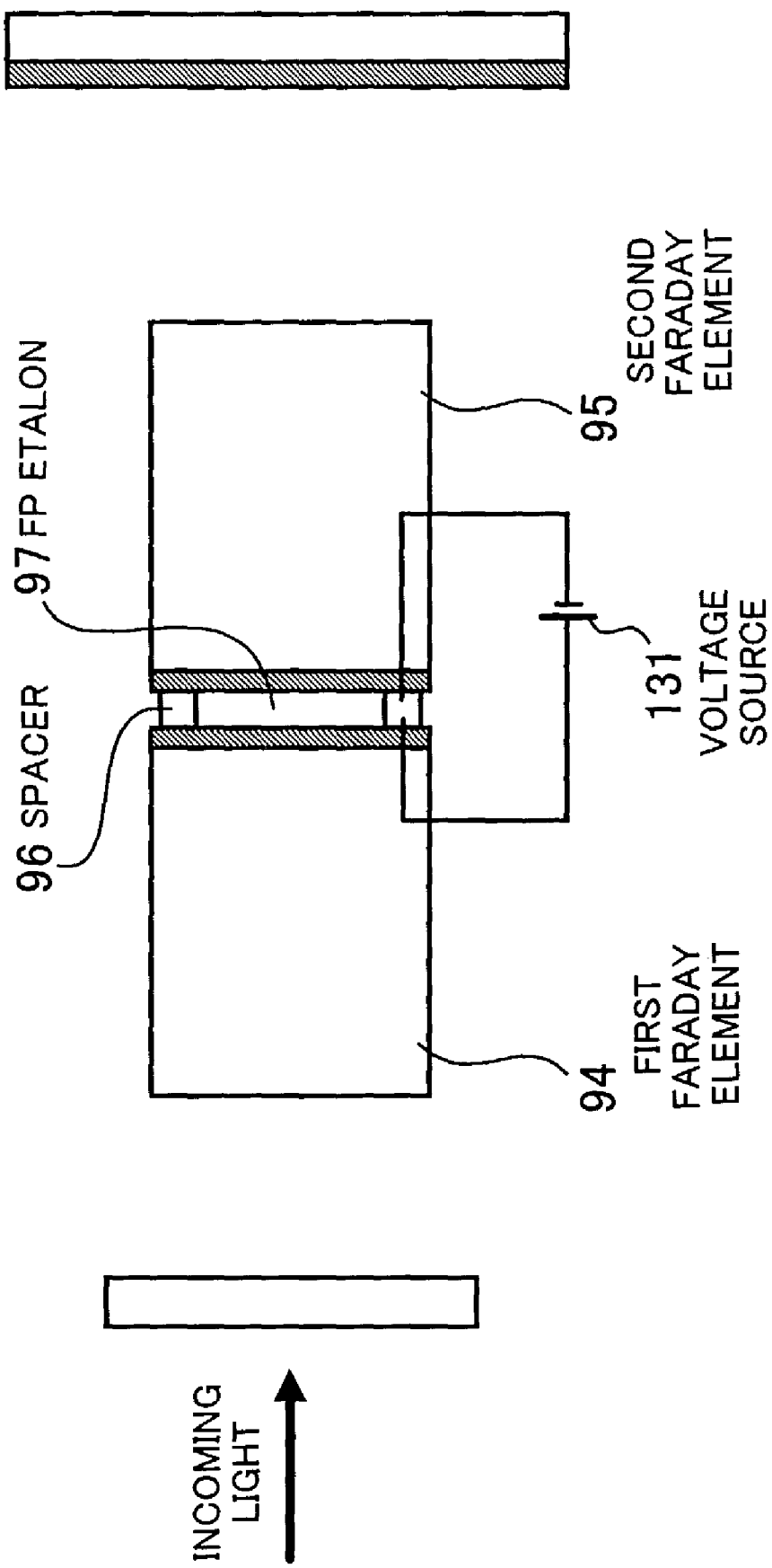
FIG. 20 is a diagram showing an example of the construction of a wavelength selection device in which the gap between the first faraday element and the second faraday element is controlled by voltage.

FIG. 19 is a diagram showing an example of the construction of a wavelength selection device in which the gap between the first faraday element and the second faraday element is controlled by temperature. FIG. 20 is a diagram showing an example of the construction of a wavelength selection device in which the gap between the first faraday element and the second faraday element is controlled by voltage. It should be noted that in FIGS. 19 and 20, component parts and elements similar or equivalent to those of the wavelength selection device shown in FIG. 15 are designated by identical reference numerals, and detailed description thereof is omitted.

As shown in FIG. 19, when the gap between the first faraday element 94 and the second faraday element 95 is controlled by temperature, the spacer 96 arranged between the first and second faraday element 94, 95 is formed by using a material whose volume varies with temperature. Quartz can be used as such a material, for instance. In this case, to adjust the temperature of the spacer 96, a heater 130 is arranged in the vicinity of the spacer 96. The heating temperature of the heater 130 is controlled to thereby change the volume of the spacer 96 such that wavelengths allowed to pass through the FP etalon 97 are changed. For instance, when quartz is used as the spacer 96 as described above, for changing the thickness of the spacer 96 by the temperature thereof, it is necessary to change the temperature by a degree of approximately 45°. Therefore, the only requirement is that the temperature of the spacer 96 can be changed over a range of 20° to 65°, for instance.

On the other hand, when the gap between the first faraday element 94 and the second faraday element 95 is controlled by voltage, as shown in FIG. 20, the spacer 96 arranged between the first and second faraday element 94, 95 is formed by using a piezoelectric element. A polycrystalline ceramic, such as lead titanate zirconate ($PbTiO_3$—$PbZrO_3$, PZT), or the like, can be used as the piezoelectric element. The piezoelectric element forming the spacer 96 is connected to a voltage source 131 for applying voltage to the spacer 96 in the direction of the optical axis, and the voltage applied to the spacer 96 is controlled to thereby change the volume of the spacer 96 such that the wavelengths allowed to pass through the FP etalon 97 are changed. For instance, assuming that a PZT is used as the spacer 96 as described above, and the thickness of the spacer 96 is changed by applying the voltage in the direction of the optical axis, it is necessary to apply a voltage of approximately 200 V.

As described above, when the wavelengths allowed to pass through the FP etalon 97 are adjusted by control of the temperature of the spacer and the voltage applied to the same, it is necessary to change the thickness of the spacer 96 by a half or more of the wavelength. In the illustrated examples, it is necessary to change the thickness of the spacer 96 by at least 0.775 μm which is equal to one half of the wavelength of 1.55 μm.

Figure 21A:
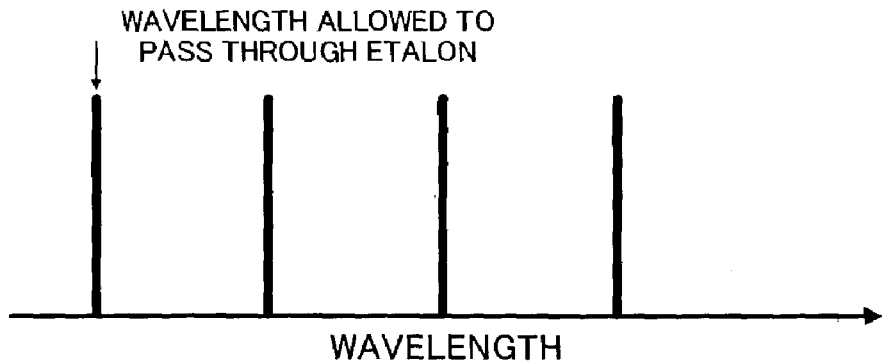
Figure 21B:
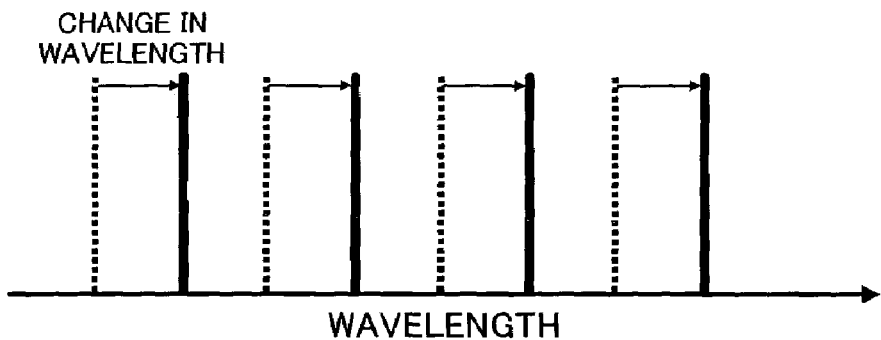
Figure 21C:
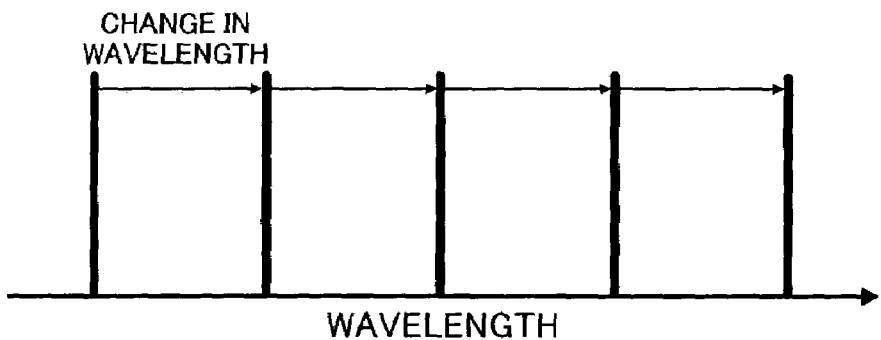

FIGS. 21(A) to 21(C) are diagrams which are useful in explaining changes in the wavelengths allowed to pass through the FP etalon 97, caused by changes in the thickness of the spacer, in which FIG. 21(A) shows a case where the thickness of the spacer is not changed, FIG. 21(B) shows a case where the thickness of the spacer is changed by ¼ of the wavelength, and FIG. 21(C) shows a case where the thickness of the spacer is changed by ½ of the wavelength.

When wavelengths allowed to pass through the etalon in a state where the thickness of the spacer is not changed are as shown in FIG. 21(A), if the thickness of the spacer is changed by ¼ of the wavelength, as shown in FIG. 21(B), the wavelengths allowed to pass are displaced by a half of an interval of wavelengths allowed to pass through the etalon (free spectrum range). More specifically, when the thickness of the spacer is changed by ¼ of the wavelength, the wavelengths allowed to pass after the change in the thickness of the spacer are each displaced to an intermediate position between the original wavelength before the change in the thickness of the spacer and a wavelength adjacent thereto. Then, when the thickness of the spacer is further changed by ¼ of the wavelength, in other words, when the thickness of the etalon is changed by ½ of the wavelength from the original state, as shown in FIG. 21(C), the wavelengths allowed to pass are each changed just by the interval of the wavelength so that it is displaced to the position of a wavelength which was adjacent to the original one before the change in the thickness of the spacer. Accordingly, if the thickness of the spacer can be changed over ½ of the wavelength, it is possible to variably set the wavelengths allowed to pass through the etalon at desired positions, thereby making it possible to adjust the wavelengths allowed to pass sufficiently.

In the wavelength selection device 90 described above, assuming that the thickness of the spacer 96 is 1.5 mm, to change the thickness of the etalon by ½ of the wavelength, i.e. 0.775 μm, it is required to change the temperature of the spacer and the voltage applied to the spacer, over a range of approximately 20° to 65°, and by approximately 200 V, respectively, as described above.

Of course, not only the wavelength selection device 90 shown in FIG. 15 but also each of the respective wavelength selection devices 100, 110, 120 shown in FIGS. 16 to 18 can be configured such that the gap between the first faraday element 94 and the second faraday element 95 is controlled by temperature or voltage to thereby change the wavelengths allowed to pass through the etalon.

Further, if the wavelength selection device 90 according to the third embodiment is arranged within a resonator, it is possible to form a wavelength selection laser for selectively causing laser oscillation to occur at at least one wavelength allowed to pass through the etalon.

Figure 22:
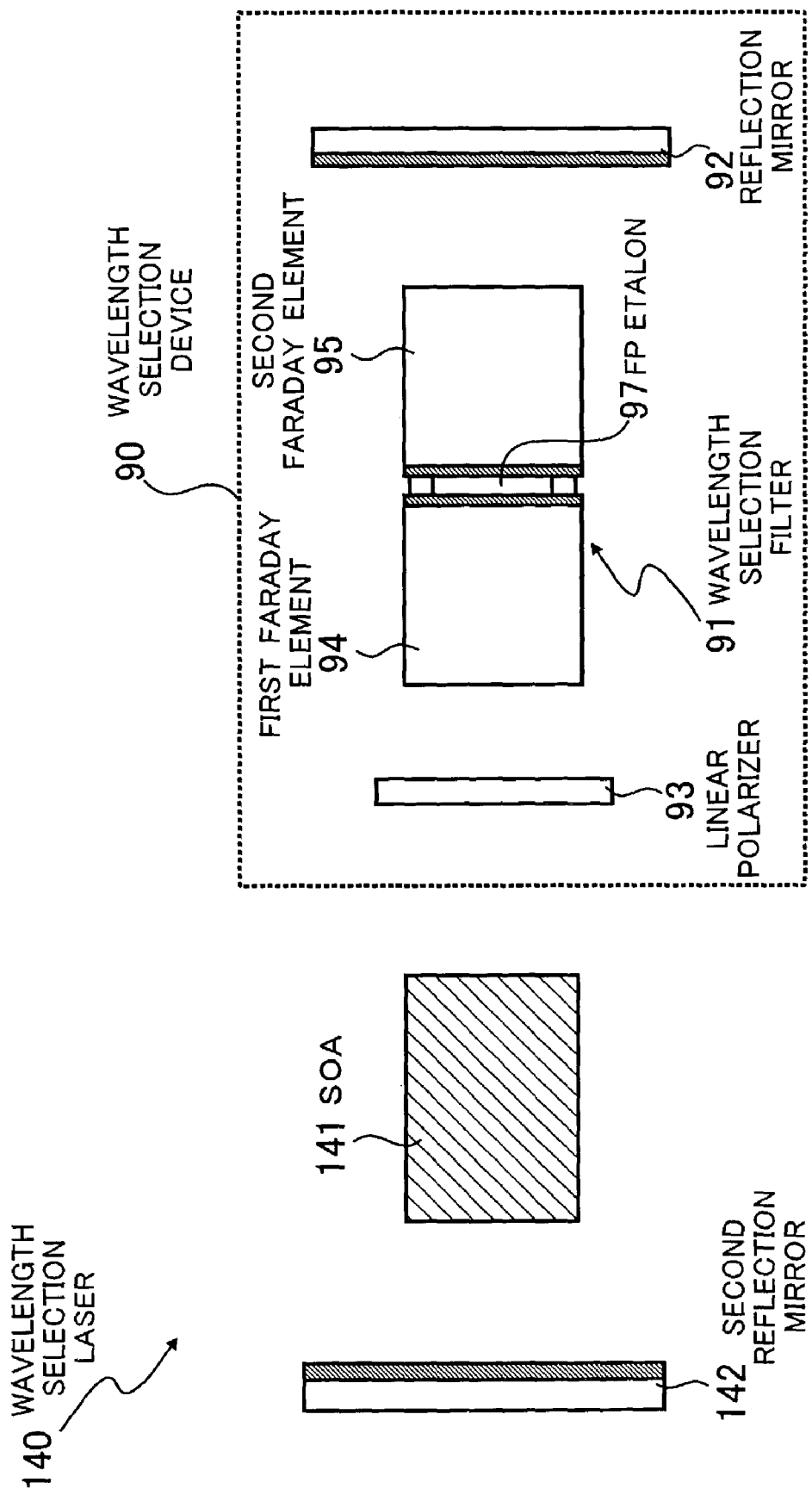
FIG. 22 is a diagram showing an example of the construction of a wavelength selection laser which employs the wavelength selection device according to the third embodiment.

FIG. 22 shows an example of the construction of a wavelength selection laser which employs the wavelength selection device according to the third embodiment. It should be noted that in FIG. 22, component parts and elements similar or equivalent to those of the wavelength selection devices shown in FIG. 15 are designated by identical reference numerals, and detailed description thereof is omitted.

The wavelength selection laser 140 shown in FIG. 22 includes the wavelength selection device 90, and an SOA 141 arranged as a gain medium in front of the linear polarizer 93 of the wavelength selection device 90. The SOA 141 has an active layer thereof formed by a multiple quantum well, and is arranged such that a gain thereof depends on the polarization direction, and a polarization direction in which the gain is maximum coincides with the polarization direction of light allowed to pass through the linear polarizer 93 of the wavelength selection device 90. Opposite end faces of the SOA 141 are covered with non-reflection coating. Further, the wavelength selection laser 140 has a second reflection mirror 142 arranged toward a laser-emitting end face of the SOA 141, that is, on an end face on a side there remote from the linear polarizer 93. The second reflection mirror 142 is arranged in a manner opposed to the reflection mirror 92 of the wavelength selection device 90. A resonator of the wavelength selection laser 140 is formed between The second reflection mirror 142 and the reflection mirror 92.

In the wavelength selection laser 140 constructed as above, desired wavelengths of light generated from the SOA 141 are selected by the FP etalon 97 of the wavelength selection filter 91. Light of the desired wavelength is resonated between the reflection mirror 92 and the second reflection mirror 142, and then lasing occurs. In this process, the wavelength selection device 90 blocks non-selected light reflected from the FP etalon 97 by the linear polarizer 93 thereof, thereby inhibiting the non-selected light from returning to the second reflection mirror 142. This enables stable laser oscillation to occur at the wavelengths selected by the FP etalon 97. Further, since the wavelength selection laser 140 uses the wavelength selection filter 91 in which the first and second faraday elements 94, 95 are integrally formed with the FP etalon 97, the whole wavelength selection laser 140 can be made compact in size.

Further, in the wavelength selection laser 140, the laser-emitting end face of the SOA 141 may be formed as a cleavage plane coated with an optical thin film having a reflectance of 10%, and the resonator may be formed between the cleavage plane and the reflection mirror 92. In this case, only an end face of the SOA 141 on a side remote from the laser-emitting end face is covered with non-reflection coating. Further, if a collimating lens, not shown, covered with non-reflection coating is arranged between the SOA 141 and the linear polarizer 93, rays of light emitted from the SOA 141 can enter the FP etalon 97 of the wavelength selection device 90 in parallel with the optical axis.

Further, the wavelength selection device 90 shown in FIG. 15 can be applied to a tunable laser which includes a gain medium, an etalon, and an AOTF, within a resonator thereof, for causing laser oscillation to occur at a desired wavelength selected by the AOTF from periodical wavelengths allowed to pass through the etalon.

Figure 23:
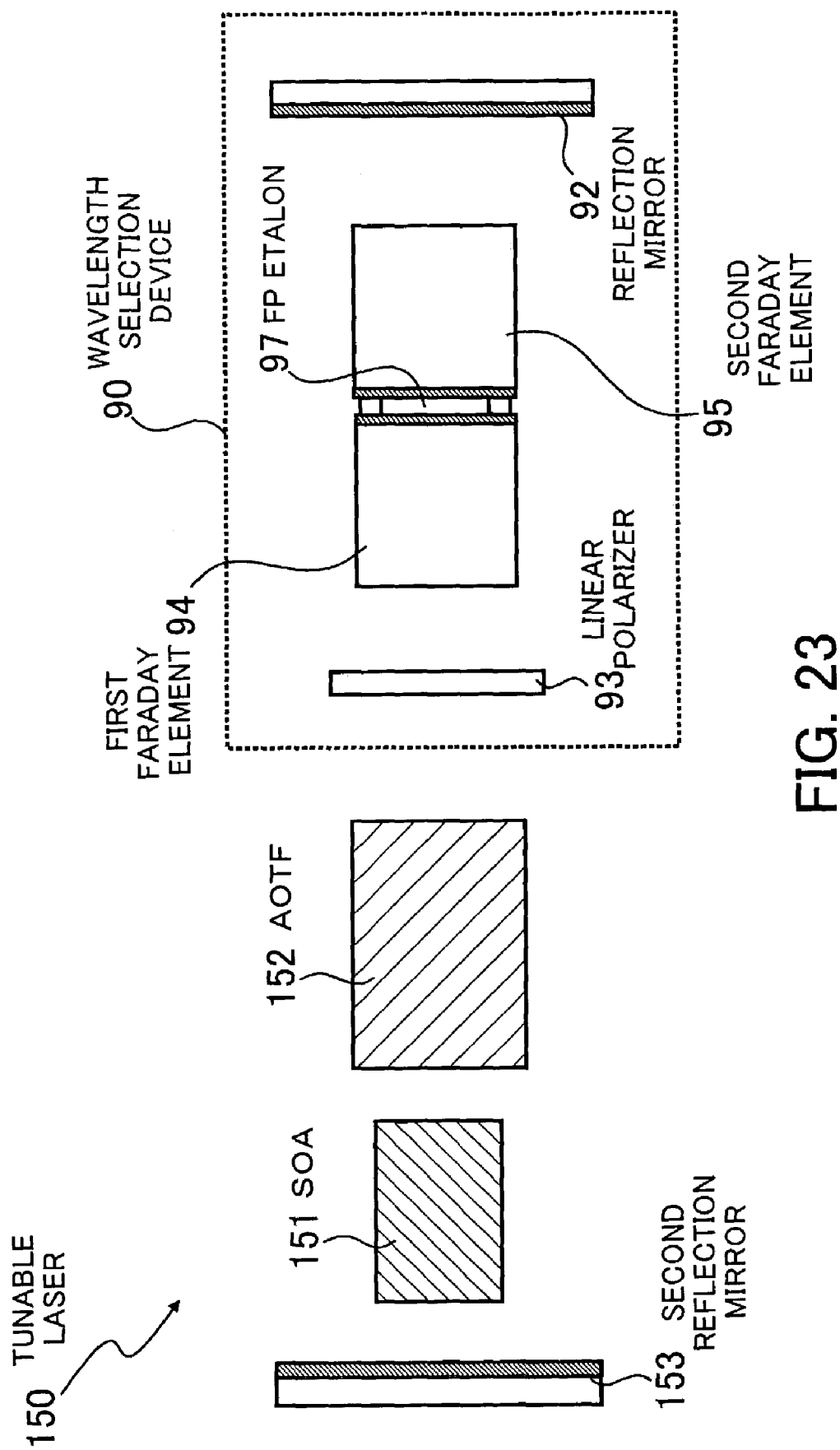
FIG. 23 is a diagram showing conceptual representation of the construction of a tunable laser which employs the wavelength selection device according to the third embodiment.

FIG. 23 shows an example of the construction of a tunable laser which employs the wavelength selection device according to the third embodiment. It should be noted that in FIG. 23, component parts and elements similar or equivalent to those of the wavelength selection device shown in FIG. 15 are designated by identical reference numerals, and detailed description thereof is omitted.

In the tunable laser 150 shown in FIG. 23, an SOA 151 as a gain medium and an AOTF 152 for selectively passing only light of a desired wavelength are arranged in front of the linear polarizer 93 of the wavelength selection device 90. The SOA 151 has an active layer thereof formed by a multiple quantum well, and is arranged such that a gain thereof depends on the polarization direction of light, and a polarization direction in which the gain is maximum coincides with the polarization direction of light capable of passing through the linear polarizer 93 of the wavelength selection device 90. A second reflection mirror 153 is arranged toward a laser-emitting end face of the SOA 151 such that a resonator is formed between the second reflection mirror 153 and the reflection mirror 92 of the wavelength selection device 90.

According to the tunable laser 150 constructed as above, it is possible to realize a laser oscillation occurring at a desired wavelength selected by the AOTF 152 from wavelengths at regular intervals allowed to pass through the FP etalon 97, without degrading the characteristics of the FP etalon 97, by suppressing adverse effects of non-selected light. Further, since the first and second faraday elements 94, 95, and FP etalon 97 of the wavelength selection device 90 are formed as a unitary member, the wavelength selection device 90 can be made compact in size, which enables the whole tunable laser 150 to be made compact in size.

Figure 24:
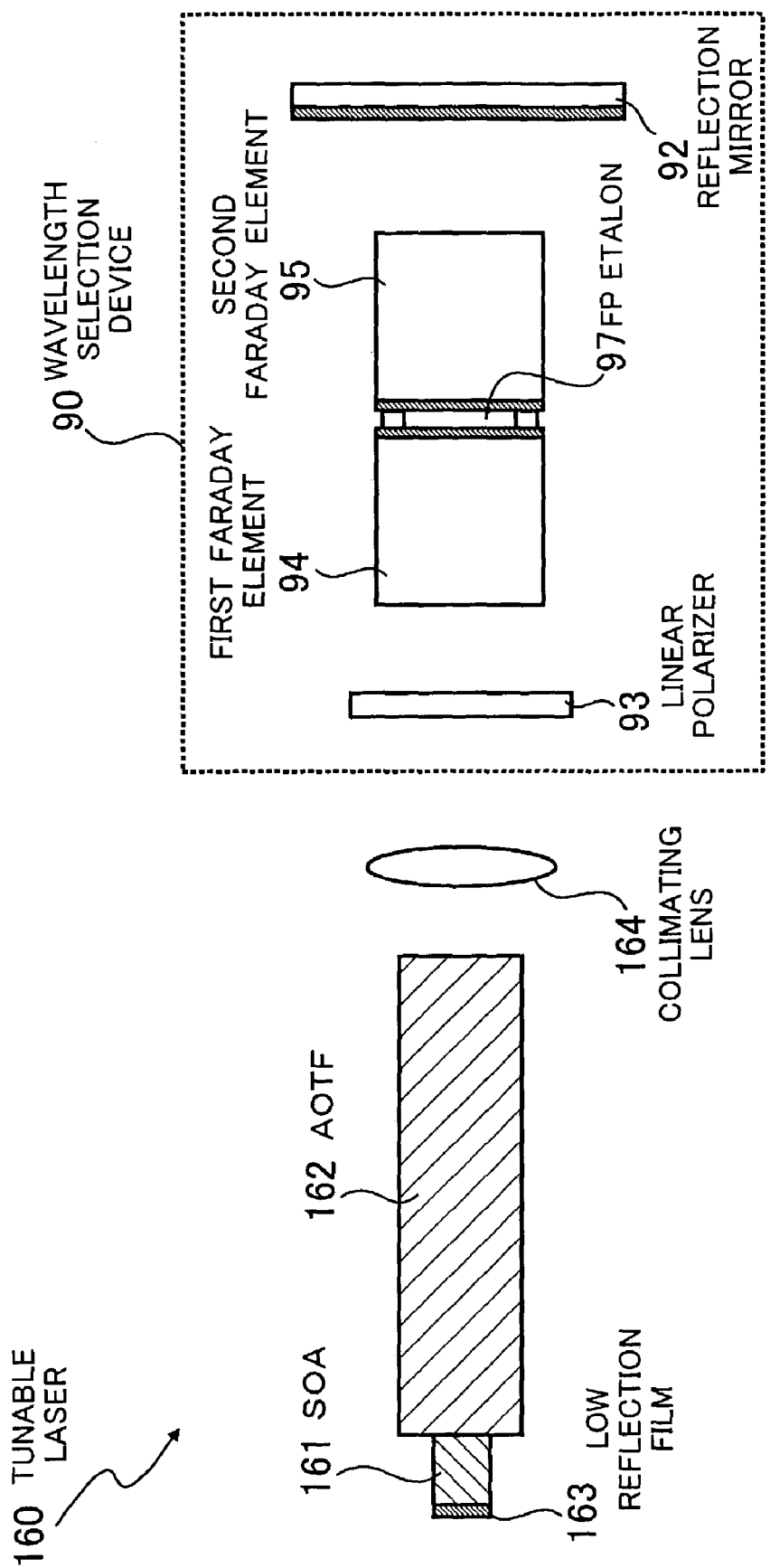
FIG. 24 is a diagram showing an example of a tunable laser to which is applied the wavelength selection device according to the third embodiment.
Figure 25:
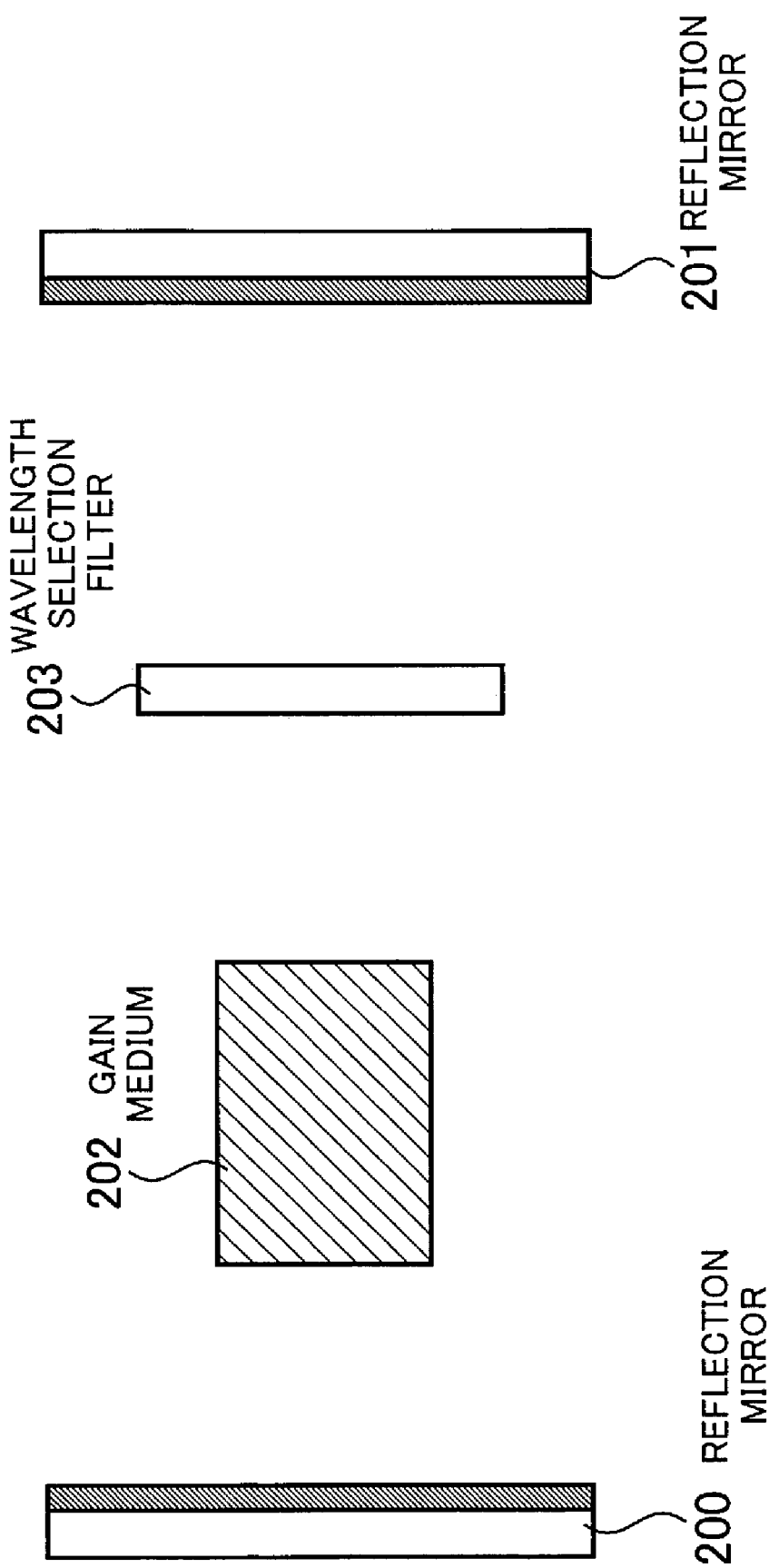
FIG. 25 is a conceptual representation of a wavelength selection laser which employs a wavelength selection filter.
Figure 26:
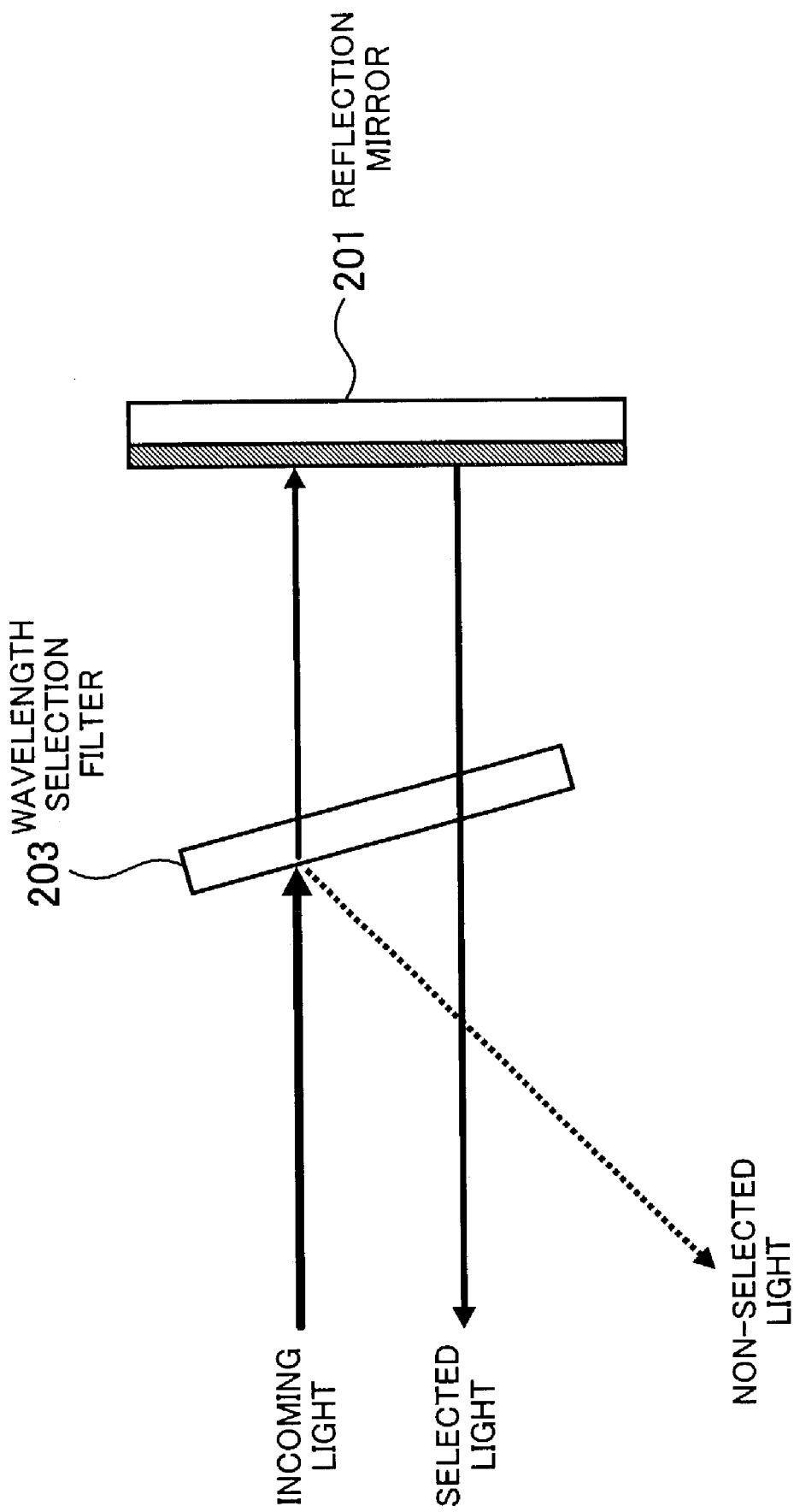
FIG. 26 is a diagram which is useful in explaining a conventional method for suppressing adverse effects of non-selected light.

FIG. 24 shows an example of a tunable laser to which is applied the wavelength selection device according to the third embodiment. It should be noted that in FIG. 24, component parts and elements similar or equivalent to those of the wavelength selection devices shown in FIGS. 15 and 23 are designated by identical reference numerals, and detailed description thereof is omitted.

The tunable laser 160 has an SOA 161 and an AOTF 162 arranged in front of the linear polarizer 93 of the wavelength selection device 90. A laser-emitting end face of the SOA 161 is formed as a cleavage plane coated with a low reflection film 163 having a reflectance of 10%, such that a resonator is formed between the low reflection film 163 and the reflection mirror 92.

The AOTF 162 is joined to an end face of the SOA 161 on a side remote from the low reflection film 163, by the butt-joint method. A collimating lens 164 is arranged between the AOTF 162 and the linear polarizer 93 such that rays of light emitted from the AOTF 162 enter the FP etalon 97 of the wavelength selection device 90 in parallel with the optical axis. It should be noted that in the tunable laser 160, the end face of the SOA 161 on the side remote from the low reflection film 163, opposite end faces of the AOTF 162, and the collimating lens 164 are covered with non-reflection coating.

The tunable laser 160 constructed as above makes it possible to realize stable laser oscillation as well as to make the whole tunable laser 150 compact in size. It should be noted that tunable filters used in the above tunable lasers 150, 160 are not limited to the AOTFs 152, 162, but it is possible to obtain the same advantageous effects as provided by the AOTFs 152, 162 by using any other suitable tunable filters.

Of course, it is possible to apply not only the wavelength selection device 90 shown in FIG. 15 but also the wavelength selection devices 100, 110, 120 shown in FIGS. 16 to 18, to the wavelength selection laser 140 and the tunable lasers 150, 160.

As describe hereinabove, the wavelength selection device 90 according to the third embodiment is configured such that the wavelength selection filter 91 in which the FP etalon 97 is formed by the reflection films 94a, 95a formed on the opposed and parallel end faces of the first and second faraday elements 94, 95 each for rotating the polarization by 45 degrees, is arranged between the linear polarizer 93 and the reflection mirror 92. This makes it possible not only to suppress adverse effects of light reflected from the FP etalon 97 without spoiling the characteristics of the etalon but also to make the wavelength selection device 90 compact in size and the alignment of components of the device easy to effect. Further, by using the wavelength selection device 90 constructed as above, it is possible to realize the wavelength selection laser 140 and the tunable lasers 150, 160 capable of causing stable laser oscillation and compact in size.

Although in the wavelength selection device 90 according to the third embodiment, the FP etalon 97 is formed by forming the respective reflection films 94a, 95a on the opposed end faces of the first and second faraday elements 94, 95, this is not limitative, but it is also possible to form the FP etalon only by the opposed and parallel end faces of the first and second faraday elements 94, 95 without forming the reflection films 94a, 95a.

Further, similarly to the second embodiment, the wavelength selection device 90 according to the third embodiment can be configured to have another linear polarizer arranged between the second faraday element 95 and the reflection mirror 92. The same applies to the wavelength selection devices 100, 110, 120 described above as the variations of the wavelength selection device 90. In the above cases, if the linear polarizer is arranged between the second faraday element 95 and the reflection mirror 92 or between the second faraday element 95 and the high reflection film 101, multiple reflections within the devices can be suppressed.

Although in the above descriptions, the cases where faraday elements are used as elements for rotating the polarization are described by way of example, this is not limitative, but any other suitable element can be employed so long as it is capable of rotating the polarization by 45 degrees.

Further, although in the above descriptions, each wavelength selection device is configured such that one element rotates the polarization by 45 degrees, the wavelength selection device may be configured such that a plurality of combined elements rotate the polarization by 45 degrees in total.

As described hereinbefore, in the present invention, the wavelength selection device is configured such that a linear polarizer is arranged on a side of a wavelength selection filter from which incoming light enters the wavelength selection filter, and that elements for rotating the polarization by 45 degrees are arranged at respective locations between the linear polarizer and the wavelength selection filter, and between the wavelength selection filter and a reflection mirror for reflecting light transmitted through the wavelength selection filter. This makes it possible not only to suppress adverse effects of non-selected light reflected from the wavelength selection filter but also to prevent degradation of finesses of the wavelength selection filter and an increase in insertion loss of the wavelength selection filter. Further, if the wavelength selection device is applied to a wavelength selection laser or a tunable laser, it is possible to suppress adverse effects of non-selected light and realize stable laser oscillation without spoiling the characteristics of the wavelength selection filter.

Further, if another linear polarizer, whose polarization direction is perpendicular to the polarization direction of the linear polarizer arranged on the side of the wavelength selection filter from which incoming light enters the wavelength selection filter, is arranged between the element which is arranged between the wavelength selection filter and the reflection mirror, for rotating the polarization by 45 degrees, and the reflection mirror, it is possible to prevent occurrence of multiple reflection within the wavelength selection device.

Further, in the present invention, the wavelength selection device is configured such that a wavelength selection filter in which an etalon is formed by opposed and parallel end faces of a first element and a second element each for rotating the polarization by 45 degrees, or by reflection films formed on the opposed and parallel end faces of the first and second elements, is arranged between the linear polarizer and the reflection mirror. This makes it possible not only to suppress adverse effects of light reflected from the etalon but also to make the wavelength selection device compact in size and the alignment of components of the device easy to effect. Further, by using the wavelength selection device constructed as above, it is possible to realize small-sized wavelength selection laser and tunable lasers capable of causing stable laser oscillation to occur.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A wavelength selection device including a wavelength selection filter for passing at least one component of at least one desired wavelength of an incoming light and reflecting components of wavelengths other than the at least one desired wavelength of the incoming light, wherein the at least one component having passed through the wavelength selection filter is reflected by a reflection mirror back to the wavelength selection filter, to thereby obtain the at least one component of the at least one desired wavelength, the wavelength selection device comprising:

a linear polarizer arranged on a side of the wavelength selection filter from which the incoming light enters the wavelength selection filter; and only one element for rotating a polarization of light by 45 degrees, arranged at each of respective locations between said linear polarizer and the wavelength selection filter, and between the wavelength selection filter and the reflection mirror, wherein the incoming light is a light collimated by a collimating lens, and the reflection mirror is a flat mirror.

2. The wavelength selection device according to claim 1, wherein the wavelength selection filter is a Fabry-Perot etalon.

3. The wavelength selection device according to claim 1, wherein said at least one element is a faraday element for rotating the polarization of light by 45 degrees.

4. The wavelength selection device according to claim 1, wherein said linear polarizer is used as a first linear polarizer, and wherein a second linear polarizer whose polarization direction is perpendicular to a polarization direction of said first linear polarizer is arranged between said at least one element arranged between the wavelength selection filter and the reflection mirror.

5. A wavelength selection laser for causing laser oscillation to occur at at least one wavelength selected by a wavelength selection device, comprising:

a wavelength selection device including a wavelength selection filter for passing at least one component of at least one desired wavelength of an incoming light and reflecting components of wavelengths other than the at least one desired wavelength of the incoming light, a first reflection mirror for reflecting the at least one component having passed through said wavelength selection filter, a linear polarizer arranged on a side of said wavelength selection filter from which the incoming light enters said wavelength selection filter, and only one element for rotating a polarization of light by 45 degrees, arranged at each of respective locations between said linear polarizer and said wavelength selection filter, and between said wavelength selection filter and said first reflection mirror;

a second reflection mirror arranged on a side of said wavelength selection device from which the incoming light enters said wavelength selection device, in a manner opposed to said first reflection mirror;

a gain medium arranged between said wavelength selection device and said second reflection mirror, for producing an optical gain; and a collimating lens arranged between said wavelength selection device and said gain medium, for optically coupling said wavelength selection device and said gain medium, wherein each of said first reflection mirror and said second reflection mirror is a flat mirror.

6. The wavelength selection laser according to claim 5, wherein said gain medium is a semiconductor optical amplifier, and wherein said second reflection mirror is a cleavage plane of said semiconductor optical amplifier.

7. The wavelength selection laser according to claim 5, wherein said linear polarizer of said wavelength selection device is used as a first linear polarizer, and wherein a second linear polarizer whose polarization direction is perpendicular to a polarization direction of said first linear polarizer is arranged between said at least one element arranged between said wavelength selection filter and said first reflection mirror.

8. A tunable laser for causing laser oscillation to occur by selecting a component of light of an arbitrary one of wavelengths selected by a wavelength selection device, the tunable laser comprising:

a wavelength selection device including a wavelength selection filter for passing components of desired wavelengths of an incoming light and reflecting components of wavelengths other than the desired wavelengths of the incoming light, a reflection mirror for reflecting the components having passed through said wavelength selection filter, a linear polarizer arranged on a side of said wavelength selection filter from which the incoming light enters said wavelength selection filter, and only one element for rotating a polarization of light by 45 degrees, arranged at each of respective locations between said linear polarizer and said wavelength selection filter, and between said wavelength selection filter and said reflection mirror;

a second reflection mirror arranged on a side of said wavelength selection device from which the incoming light enters said wavelength selection device, in a manner opposed to said reflection mirror;

a gain medium arranged between said wavelength selection device and said second reflection mirror, for producing an optical gain; and a tunable filter arranged between said gain medium and said wavelength selection device, for selecting a component of an arbitrary wavelength out of the components selected by said wavelength selection device.

9. The tunable laser according to claim 8, including a lens arranged between said wavelength selection device and said tunable filter, for optically coupling said wavelength selection device and said gain medium.

10. The tunable laser according to claim 8, wherein said gain medium is a semiconductor optical amplifier, and wherein said second reflection mirror is a cleavage plane of said semiconductor optical amplifier.

11. The tunable laser according to claim 8, wherein said tunable filter is an acousto-optically tunable filter.

12. The tunable laser according to claim 8, wherein said linear polarizer of said wavelength selection device is used as a first linear polarizer, and wherein a second linear polarizer whose polarization direction is perpendicular to a polarization direction of said first linear polarizer is arranged between said at least one element arranged between said wavelength selection filter and said reflection mirror.

13. A wavelength selection device including a wavelength selection filter for passing at least one component of at least one desired wavelength of an incoming light and reflecting components of wavelengths other than the at least one desired wavelength of the incoming light, the at least one component having passed through the wavelength selection filter being reflected by a reflection mirror back to the wavelength selection filter, to thereby obtain the at least one component of the at least one desired wavelength, wherein said wavelength selection filter includes a first element arranged on a side where the incoming light enters, for rotating a polarization of light by 45 degrees, and a second element arranged on a side toward which the at least one component of the at least one desired wavelength is transmitted, for rotating the polarization of light by 45 degrees, and wherein said wavelength selection filter is an etalon formed by opposed and parallel end faces of said first element and said second element, or by reflection films formed on the opposed and parallel end faces of said first and second elements, and at the same time, a linear polarizer is arranged on the side of said wavelength selection filter from which the incoming light enters.

14. The wavelength selection device according to claim 13, wherein said first element and said second element are faraday elements each for rotating the polarization of light by 45 degrees.

15. The wavelength selection device according to claim 13, wherein said reflection mirror is a high reflection film formed on an end face of said second element on a side remote from said first element.

16. The wavelength selection device according to claim 13, wherein said reflection mirror is joined to the end face of said second element on a side remote from said first element.

17. The wavelength selection device according to claim 13, wherein said linear polarizer is joined to an end face of said first element on a side remote from said second element.

18. The wavelength selection device according to claim 13, wherein a distance between the opposed end faces of said first element and said second element can be changed.

19. The wavelength selection device according to claim 18, wherein a material whose volume is varied with a temperature is arranged as a spacer between said first element and said second element such that the distance between the opposed end faces of said first and said second elements can be changed by varying the temperature of said material.

20. The wavelength selection device according to claim 18, wherein a piezoelectric element is arranged as a spacer between said first element and said second element such that the distance between the opposed end faces of said first and said second elements can be changed by varying a voltage applied to said piezoelectric element.

21. The wavelength selection device according to claim 13, wherein said linear polarizer is used as a first linear polarizer, and wherein a second linear polarizer whose polarization direction is perpendicular to a polarization direction of said first linear polarizer is arranged between said wavelength selection filter and said reflection mirror.

22. A wavelength selection laser for causing laser oscillation to occur at at least one wavelength selected by a wavelength selection device, comprising:
a wavelength selection device including a wavelength selection filter including a first element and a second element each for rotating a polarization of light by 45 degrees, said wavelength selection filter having an etalon formed by opposed and parallel end faces of said first element and said second element, or by reflection films formed on the opposed and parallel end faces of said first and second elements, a linear polarizer arranged on a side of said wavelength selection filter from which an incoming light enters, and a first reflection mirror for reflecting at least one component of at least one wavelength of the incoming light passed through said wavelength selection filter;
a second reflection mirror arranged on a side of said wavelength selection device from which the incoming light enters, in a manner opposed to said reflection mirror; and
a gain medium arranged between said wavelength selection device and said second reflection mirror, for producing an optical gain.

23. A tunable laser for causing laser oscillation to occur by selecting a component of light of an arbitrary one of wavelengths selected by a wavelength selection device, the tunable laser comprising:
a wavelength selection device including a wavelength selection filter including a first element and a second element each for rotating a polarization of light by 45 degrees, said wavelength selection filter having an etalon formed by opposed and parallel end faces of said first element and said second element, or by reflection films formed on the opposed and parallel end faces of said first and second elements, a linear polarizer arranged on a side of said wavelength selection filter from which an incoming light enters, and a reflection mirror for reflecting components of wavelengths of the incoming light passed through said wavelength selection filter;
a second reflection mirror arranged on a side of said wavelength selection device from which the incoming light enters, in a manner opposed to said reflection mirror;
a gain medium arranged between said wavelength selection device and said second reflection mirror, for producing an optical gain; and
a tunable filter arranged between said gain medium and said wavelength selection device, for selecting a component of an arbitrary wavelength out of the components selected by said wavelength selection device.

* * * * *